United States Patent
Lee et al.

(10) Patent No.: US 12,127,483 B2
(45) Date of Patent: Oct. 22, 2024

(54) DOPED SIDEWALL SPACER/ETCH STOP LAYER FOR MEMORY

(71) Applicant: Taiwan Semiconductor Manufacturing Company, Ltd., Hsinchu (TW)

(72) Inventors: Bi-Shen Lee, Hsinchu (TW); Hai-Dang Trinh, Hsinchu (TW); Hsun-Chung Kuang, Hsinchu (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 457 days.

(21) Appl. No.: 17/388,484

(22) Filed: Jul. 29, 2021

(65) Prior Publication Data
US 2022/0393101 A1    Dec. 8, 2022

Related U.S. Application Data

(60) Provisional application No. 63/196,364, filed on Jun. 3, 2021.

(51) Int. Cl.
*H10N 50/80* (2023.01)
*H10B 61/00* (2023.01)
*H10N 50/01* (2023.01)

(52) U.S. Cl.
CPC .............. *H10N 50/80* (2023.02); *H10B 61/00* (2023.02); *H10N 50/01* (2023.02)

(58) Field of Classification Search
CPC ......... H10N 50/80; H10N 50/01; H10B 61/00

USPC .......................................................... 257/421
See application file for complete search history.

(56) References Cited

U.S. PATENT DOCUMENTS

| | | |
|---|---|---|
| 2019/0036014 A1 | 1/2019 | Ha |
| 2020/0033425 A1 | 1/2020 | Wang et al. |
| 2020/0176041 A1 | 6/2020 | Shen et al. |
| 2020/0235286 A1 | 7/2020 | Marchack et al. |

(Continued)

OTHER PUBLICATIONS

Komin et al. "Status of Non-contact Electrical Measurements" AIP Conference Proceedings 683, 782 (2003), published on Oct. 1, 2003.

(Continued)

*Primary Examiner* — Jami Valentine Miller
(74) *Attorney, Agent, or Firm* — Eschweiler & Potashnik, LLC

(57) ABSTRACT

Various embodiments of the present disclosure are directed towards an integrated circuit (IC) chip comprising a memory cell with a sidewall spacer, and/or an etch stop layer, doped to reduce charge accumulation at an interface between the sidewall spacer and the etch stop layer. The memory cell comprises a bottom electrode, a data storage element overlying the bottom electrode, and a top electrode overlying the data storage element. The sidewall spacer overlies the bottom electrode on a common sidewall formed by the data storage element and the top electrode, and the etch stop layer lines the sidewall spacer. The sidewall spacer and the etch stop layer directly contact at the interface and form an electric dipole at the interface. The doping to reduce charge accumulation reduces an electric field produced by the electric dipole, thereby reducing the effect of the electric field on the memory cell.

20 Claims, 23 Drawing Sheets

(56) References Cited

U.S. PATENT DOCUMENTS

2021/0066591 A1   3/2021  Trinh et al.
2021/0384413 A1*  12/2021  Chang .................... H10N 50/01
2021/0391536 A1*  12/2021  Ando .................... H10N 70/041
2022/0310656 A1*  9/2022  Rabkin .................. H10B 51/30

OTHER PUBLICATIONS

Hofmeister et al. "Quantification of Nitrogen Impurity and Estimated Orowan Strengthening Through Secondary Ion Mass Spectroscopy in Aluminum Cryomilled for Extended Durations" Materials Science and Engineering, vol. 648, Nov. 11, 2015, pp. 412-417, published on Sep. 11, 2015.

Kar, Samares. "High Permittivity Gate Dielectric Materials" Springer Heidelberg New York Dordrecht London, ISBN 978-3-642-36534-8, published Jul. 2013.

Wang et al. "Large Electric-Field Modulation of Magnetic Properties in Fe Films on BiScO—PbTiO Ceramics" Journal of Nanomaterials, vol. 2010, Article ID 142750, 6 pages, 2010, published on Apr. 12, 2010.

Dai et al. "Single-wall nanotubes produced by metal-catalyzed disproportionation of carbon monoxide" Chemical Physics Letters 260 (1996) 471-475, published on Sep. 27, 1996.

Endo et al. "The Production and Structure of Pyrolytic Carbon Nanotubes (PCNTs)" 1. Phys. Chem. Solids vol. 54. No. 12, pp. 1841-1848. 1993, published in 1993.

Wikipedia.org "Acceptor (Semiconductors)" Published on Oct. 16, 2020.

Wikipedia.org "Donor (Semiconductors)" Published on Feb. 2, 2021.

Klinke, Christian. "Analysis of Catalytic Growth of Carbon Nanotubes" École Polytechnique Fédérale de Lausanne, published in 2003.

* cited by examiner

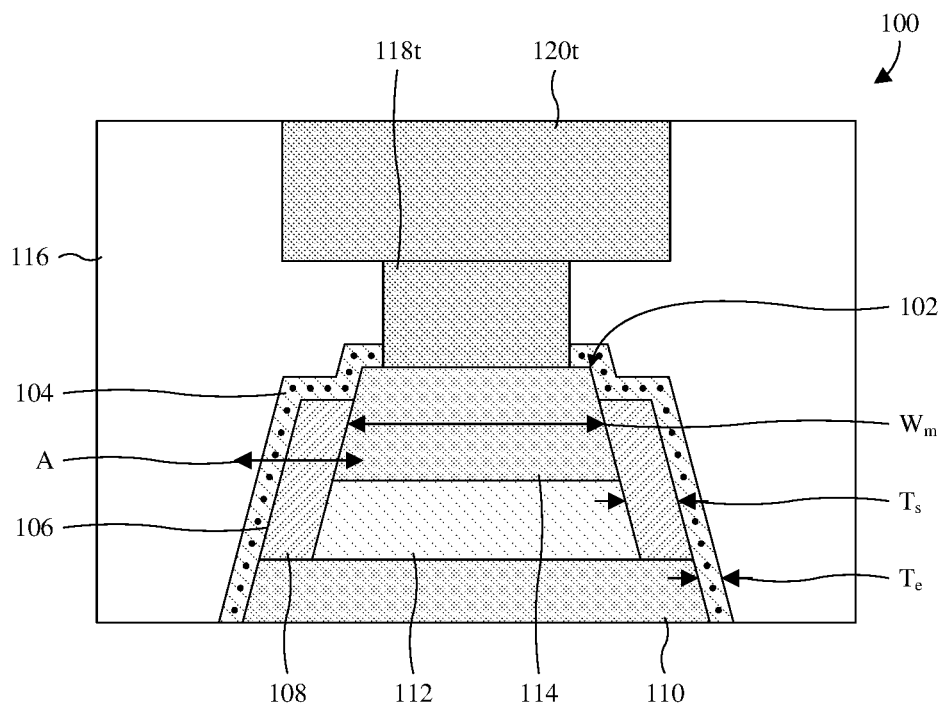
Fig. 1
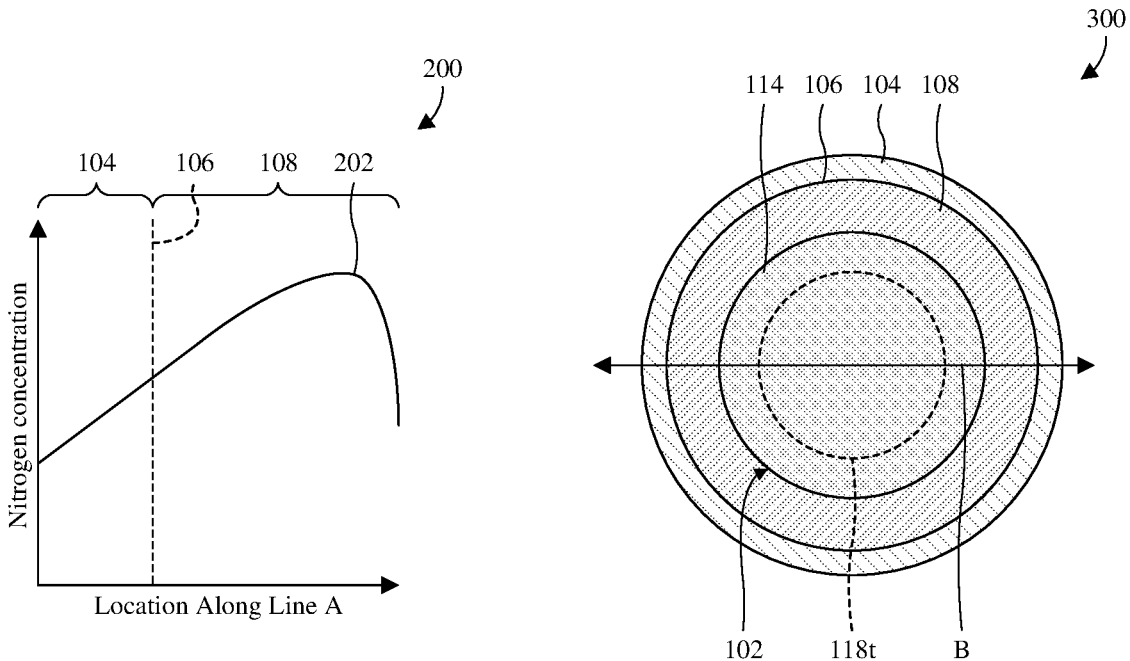
Fig. 2
Fig. 3

DOPED SIDEWALL SPACER/ETCH STOP LAYER FOR MEMORY

REFERENCE TO RELATED APPLICATION

This application claims the benefit of U.S. Provisional Application No. 63/196,364, filed on Jun. 3, 2021, the contents of which are incorporated by reference in their entirety.

BACKGROUND

Many modern-day electronic devices include non-volatile memory. Non-volatile memory is electronic memory that is able to store data in the absence of power. Some promising candidates for the next generation of non-volatile memory include magnetic random-access memory (MRAM). MRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional view of some embodiments of an integrated circuit (IC) chip comprising a memory cell in which an etch stop layer is doped to reduce charge accumulation.

FIG. 2 illustrates a graph of some embodiments of a curve describing nitrogen concentration along some embodiments of the etch stop layer of FIG. 1.

FIG. 3 illustrates a top layout view of some embodiments of the memory cell of FIG. 1.

DETAILED DESCRIPTION

Figure 4A:
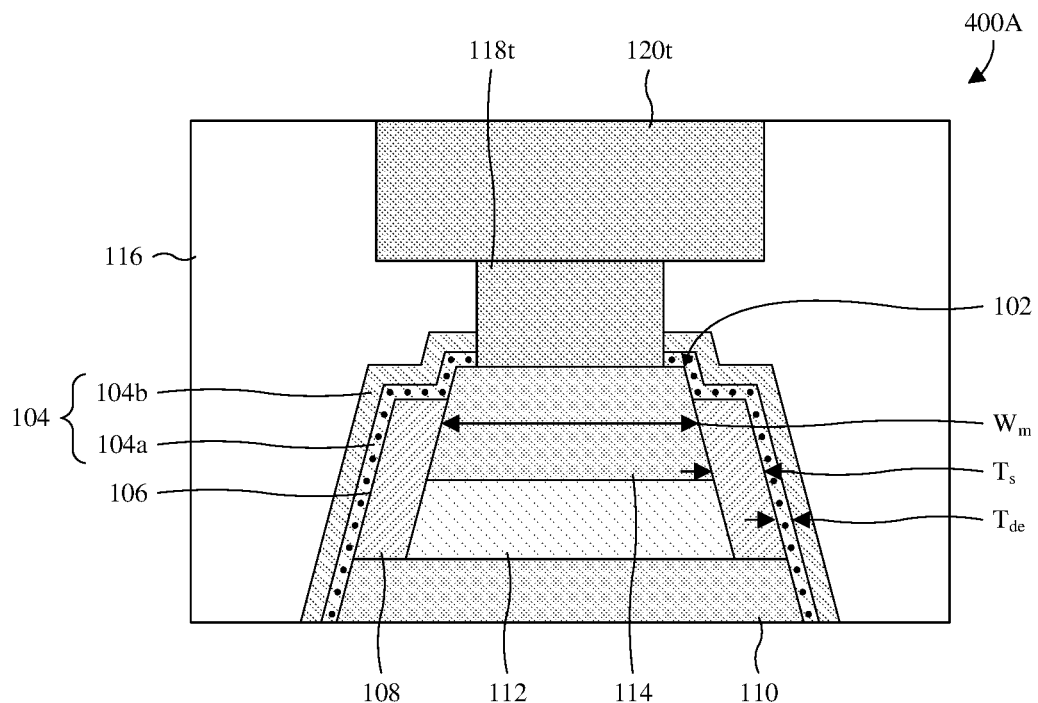
FIGS. 4A-4H illustrate cross-sectional views of some alternative embodiments of the IC chip of FIG. 1.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) chip may comprise a magnetic random-access memory (MRAM) cell in an interconnect structure of the IC chip. The MRAM cell may comprise a bottom electrode, a magnetic tunnel junction (MTJ) element over the bottom electrode, and a top electrode over the MTJ element. Further, the MRAM cell may comprise a sidewall spacer on a common sidewall formed by the MTJ element and the top electrode. The interconnect structure may comprise a top electrode via extending from the top electrode.

During formation of the top electrode via, an intermetal dielectric (IMD) layer is deposited over the MRAM cell and an etch is performed into the IMD layer to form a via opening exposing the top electrode. However, at least when the MRAM cell is small, an etchant used by the etch may erode the sidewall spacer and damage the MTJ element from the side of the MTJ element. A small MRAM cell may, for example, be an MRAM cell in which the MTJ element has a width less than about 22 nanometers or some other suitable value. To mitigate this concern, an etch stop layer may be deposited covering the MRAM cell and lining the sidewall spacer before the IMD layer is deposited. The etch stop layer may then be employed as an etch stop for the etch to prevent erosion of the sidewall spacer and hence damage to the MTJ element.

Aluminum oxide may be employed for the etch stop layer because etchants used to perform the etch may have a high selectivity for the IMD layer relative to aluminum oxide. However, a dipole may form at an interface between the etch stop layer and the sidewall spacer, whereby negative charge and positive charge may accumulate at the interface respectively in the etch stop layer and the sidewall spacer. The accumulation of charge may generate an electric field that degrades the coercive field of the MTJ element. For example, the electric field may decrease the coercive field, whereby the MTJ element may more readily change between parallel and anti-parallel states. Because these states are employed to represent data, this degradation may, in turn, reduce data retention and reduce reliability of the MRAM cell.

Various embodiments of the present disclosure are directed towards a memory cell comprising a sidewall spacer, and/or an etch stop layer, doped to reduce charge accumulation at an interface between the sidewall spacer and the etch stop layer. For example, the memory cell may be as described above, but the etch stop layer may be doped with acceptor dopants and/or the sidewall spacer may be doped with donor dopants to reduce negative charge accumulation in the etch stop layer. The acceptor dopants may lead to holes that reduce the negative charge. The donor dopants may lead to electrons that negate positive charge in the sidewall spacer, and/or that shift the electronegativity of the sidewall spacer closer to that of the etch stop layer, thereby reducing the negative charge. To the extent that the memory cell is an MRAM cell, the reduced charge accumulation may reduce or otherwise eliminate degradation of the coercive field. Hence, the MRAM cell may have high data retention and high reliability.

With reference to FIG. 1, a cross-sectional view 100 of some embodiments of an IC chip comprising a memory cell 102 is provided in which an etch stop layer 104 is doped (schematically illustrated by black dots) to reduce charge accumulation at an interface 106 between the etch stop layer 104 and a sidewall spacer 108. The memory cell 102 may, for example, be a spin-transfer torque (STT) MRAM cell, a spin-orbit torque (SOT) MRAM cell, some other suitable type of MRAM cell, a ferroelectric random-access memory (FeRAM) cell, a resistive random-access memory (RRAM), or some other suitable type of memory cell.

The memory cell 102 comprises a bottom electrode 110, a data storage element 112 overlying the bottom electrode 110, and a top electrode 114 overlying the data storage element 112. The sidewall spacer 108 overlies the bottom electrode 110 on a common sidewall formed by the data storage element 112 and the top electrode 114. Further, the sidewall spacer 108 has a top surface recessed relative to a top surface of the top electrode 114 and has a pair of segments between which the data storage element 112 and the top electrode 114 are laterally sandwiched. The etch stop layer 104 overlies the sidewall spacer 108 and the top electrode 114. Further, the etch stop layer 104 is on opposite sides of the memory cell 102 and extends along a common sidewall formed by the sidewall spacer 108 and the bottom electrode 110.

The etch stop layer 104 and the sidewall spacer 108 directly contact at the interface 106 and are respectively doped and undoped. Further, the etch stop layer 104 and the sidewall spacer 108 form an electric dipole at the interface 106, and the etch stop layer 104 is doped to reduce charge accumulation at the interface 106. By reducing the charge accumulation, the doping reduces an electric field produced by the electric dipole. As such, the electric field minimally affects electrical properties of the data storage element 112. Absent the reduction, the electric field may materially degrade electrical properties of the data storage element 112. This may, in turn, lead to failure of the memory cell 102 and/or decrease manufacturing yields.

As an example, suppose the memory cell 102 is an MRAM cell and the data storage element 112 is an MTJ element. The electric field may materially decrease the coercive voltage of the MTJ element absent the doping, such that the coercive voltage may be low. In some embodiments, such a material decrease is a decrease of more than 200 Oersted or some other suitable amount. Because of the decrease, the MTJ element may readily change between parallel and anti-parallel states and hence data retention and reliability of the MRAM cell may be poor. Therefore, at least in the case of the memory cell 102 being an MRAM cell, the doping may lead to a high coercive voltage and hence good data retention and reliability.

The electric dipole may, for example, form due to differences in oxygen areal density between the etch stop layer 104 and the sidewall spacer 108 and/or due to large differences in electronegativities. In some embodiments, the electric dipole is such that negative charge accumulates at the interface 106 in the etch stop layer 104 and positive charge accumulates at the interface 106 in the sidewall spacer 108. Such embodiments may, for example, arise when the etch stop layer 104 has a greater oxygen areal density than the sidewall spacer 108 and/or a lesser electronegativity than the sidewall spacer 108. In other embodiments, the electric dipole is such that negative charge accumulates at the interface 106 in the sidewall spacer 108 and positive charge accumulates at the interface 106 in the etch stop layer 104. Such embodiments may, for example, arise when the etch stop layer 104 has a lesser oxygen areal density than the sidewall spacer 108 and/or a greater electronegativity than the sidewall spacer 108.

To the extent that negative charge accumulates in the etch stop layer 104, the etch stop layer 104 may be doped with acceptor dopants. The acceptor dopants result in holes that negate the negative charge in the etch stop layer 104. To the extent that positive charge accumulates in the etch stop layer 104, the etch stop layer 104 may be doped with donor dopants. The donor dopants result in electrons that negate the positive charge in the etch stop layer 104. The electric dipole has a net charge of zero, such that reducing accumulated charge in the etch stop layer 104 has the affect of reducing accumulated charge in the sidewall spacer 108 and vice versa.

An acceptor dopant is an atom that has fewer valence electrons than atoms being replaced by the acceptor dopant. For example, nitrogen may be an acceptor dopant when replacing oxygen in a metal oxide because nitrogen has five valence electrons whereas oxygen has six valence electrons. In contrast with an acceptor dopant, a donor dopant is an atom that has more valence electrons than atoms being replaced by the donor dopant. For example, chlorine may be a donor dopant when replacing oxygen in silicon oxide because chlorine has seven valence electrons whereas oxygen has six valence electrons.

With continued reference to FIG. 1, an intermetal dielectric (IMD) layer 116 overlies the etch stop layer 104, and a top electrode via 118$t$ and a top electrode wire 120$t$ are inset into the IMD layer 116. Further, the top electrode via 118$t$ extends from the top electrode wire 120$t$ to the top electrode 114. As will be seen hereafter, the etch stop layer 104 may be employed as an etch stop while performing an etch to form a via opening within which the top electrode via 118$t$ is formed. As such, an etchant used by the etch may have a low etch rate for the etch stop layer 104 relative to the IMD layer 116. A low etch rate may, for example, be an etch rate that is less than about $\frac{1}{20}^{th}$, $\frac{1}{50}^{th}$, $\frac{1}{100}^{th}$, or some other suitable fraction of an etch rate of the IMD layer 116. In some embodiments, the low etch rate is, or is less than, about 26.6 angstroms per minute (A/min), about 10 A/min, or some other suitable value.

At least when the memory cell 102 is small, the etchant used by the etch may erode the sidewall spacer 108 and damage the data storage element 112 from the side absent the etch stop layer 104. The memory cell 102 may, for example, be small when a width $W_m$ of the memory cell 102 is less than about 22 nanometers or some other suitable value. However, because the etchant may have the low etch rate for the etch stop layer 104 relative to the IMD layer 116, the etch stop layer 104 may prevent the sidewall spacer 108 and the data storage element 112 from erosion and damage. Further, it has been appreciated that doping the etch stop layer 104 to reduce charge accumulation at the interface 106 does not significantly affect the low etch rate.

In some embodiments, the etchant also has a low etch rate for the etch stop layer 104 relative to that of the sidewall spacer 108. For example, the etchant may have an etch rate for the etch stop layer 104 that is less than about $\frac{1}{20}^{th}$, $\frac{1}{50}^{th}$, $\frac{1}{100}^{th}$, or some other suitable fraction of an etch rate of the sidewall spacer 108. In some embodiments, etch residue of the sidewall spacer 108 and etch residue of the etch stop layer 104, when etched by the etchant or some other suitable etchant, are such that the etch residue of the etch stop layer 104 has a higher boiling point than the etch residue of the sidewall spacer 108. It has been appreciated that a higher boiling point corresponds to a lower etch rate, and a lower boiling point corresponds to a higher etch rate. The etchant may, for example, be or comprise carbon tetrafluoride (e.g., $CF_4$) or some other suitable etchant. In some embodiments, the etch residue of the etch stop layer 104 has a boiling point of about, or greater than about, −86 degrees Celsius or some other suitable value.

In some embodiments, the etch stop layer 104 is or comprises a metal oxide and/or is a dielectric with a high dielectric constant greater than about 3.9, 10, or some other suitable value. In some embodiments, the etch stop layer 104 without dopants is or comprises aluminum oxide (e.g., $AlO_x$), tantalum oxide (e.g., $TaO_x$), titanium oxide (e.g., $TiO_x$), ruthenium oxide (e.g., $RuO_x$), silver oxide (e.g., $AgO_x$), tungsten oxide (e.g., $WO_x$), vanadium oxide (e.g., $VO_x$), tin oxide (e.g., $SnO_x$), zirconium oxide (e.g., $ZrO_x$), hafnium oxide (e.g., $HfO_x$), lanthanum oxide (e.g., $LaO_x$), magnesium oxide (e.g., $MgO_x$), calcium oxide (e.g., $CaO_x$), some other suitable material(s), or any combination of the foregoing. Further, in some embodiments, the etch stop layer 104 without dopants has an atomic percentage of metal less than about 40%, 30%, or some other suitable value.

In some embodiments in which the etch stop layer 104 is doped with acceptor dopants, the acceptor dopants are or comprise nitrogen (e.g., N), hydrogen (e.g., H), boron (e.g., B), lithium (e.g., Li), carbon (e.g., C), phosphorous (e.g., P), gallium (e.g., Ga), aluminum (e.g., Al), ammonia (e.g., $NH_3$), some other suitable acceptor dopants, or any combination of the foregoing. Hence, the acceptor dopants may be metal or non-metal. In some embodiments in which the etch stop layer 104 is doped with metal acceptor dopants, an atomic percentage of metal in the etch stop layer 104 is greater than about 40%, 50%, or some other suitable value. In some embodiments, doping the etch stop layer 104 with the metal acceptor dopants may increase an atomic percentage of metal in the etch stop layer 104 from less than a threshold percentage to more than the threshold percentage, where the threshold percentage is 40% or some other suitable percentage.

In some embodiments in which the etch stop layer 104 is doped with acceptor dopants, the etch stop layer 104 is or comprises nitrogen-doped aluminum oxide (e.g., AlON), hydrogen-doped aluminum oxide (e.g., AlOH), boron-doped aluminum oxide (e.g., AlOB), carbon-doped aluminum oxide (e.g., AlOC), lithium-doped aluminum oxide (e.g., AlOLi), phosphorous-doped aluminum oxide (e.g., AlOP), nitrogen-doped tantalum oxide (e.g., TaON), nitrogen-doped titanium oxide (e.g., TiON), aluminum-doped tantalum oxide (e.g., TaAlO), aluminum-doped titanium oxide (e.g., TiAlO), nitrogen-doped aluminum (e.g., AlN), nitrogen-doped titanium (e.g., TiN), nitrogen-doped ruthenium oxide (e.g., RuON), hydrogen-doped silver oxide (e.g., AgOH), nitrogen-doped tungsten oxide (e.g., WON), nitrogen-doped vanadium oxide (e.g., VON), hydrogen-doped strontium (e.g., SnOH), hydrogen-doped zirconium oxide (e.g., ZrON), nitrogen-doped hafnium oxide (e.g., HfON), nitrogen-doped lanthanum oxide (e.g., LaON), hydrogen-doped magnesium oxide (e.g., MgOH), hydrogen-doped calcium oxide (e.g., CaOH), some other suitable doped material(s), or any combination of the foregoing.

In some embodiments, a thickness $T_e$ of the etch stop layer 104 is about 10-1000 angstroms, about 10-500 angstroms, about 500-1000 angstroms, or some other suitable value. If the thickness $T_e$ is too small (e.g., less than about 10 angstroms), the etch stop layer 104 may be unable to protect the sidewall spacer 108 from erosion while forming the top electrode via 118t, whereby the data storage element 112 may become damaged. If the thickness $T_e$ is too large (e.g., more than about 1000 angstroms), scaling down of the IC chip may be hindered.

In some embodiments, a doping concentration of the etch stop layer 104 is three or more times a concentration of any impurities in the etch stop layer 104 before the doping and/or is three or more times a concentration of any impurities in the sidewall spacer 108. In some embodiments in which the etch stop layer 104 is doped with nitrogen, a percentage of nitrogen in the etch stop layer 104 exceeds about 300 counts/second, 500 counts/second, or some other suitable value according to secondary-ion mass spectrometry (SIMS).

In some embodiments, a charging voltage of the etch stop layer 104 is less than it would otherwise be if undoped. The charging voltage may, for example, be determined by a QUANTOX process tool or some other suitable process tool. Such a process tool may, for example, introduce charge to the etch stop layer 104 until a neutral state is achieved. In some embodiments in which the etch stop layer 104 is aluminum oxide doped with ammonia (e.g., $NH_3$), the charging voltage may be, or be less than, about 1.53 volts or some other suitable value.

In some embodiments, the sidewall spacer 108 is or comprises silicon nitride (e.g., $SiN_x$), silicon carbide (e.g., SiC), silicon oxycarbide (e.g., SiOC), silicon oxynitride (e.g., SiON), silicon oxide (e.g., $SiO_x$), some other suitable material(s), or any combination of the foregoing. In some embodiments, a thickness $T_s$ of the sidewall spacer 108 is about 10-1000 angstroms, about 10-500 angstroms, about 500-1000 angstroms, or some other suitable value. In at least some embodiments in which the sidewall spacer 108 consists essentially of silicon nitride, silicon carbide, or some other suitable material devoid of oxygen, the sidewall spacer 108 may comprise a native oxide layer at the interface 106. The native oxide layer may, for example, facilitate formation of the electric dipole at the interface 106.

In some embodiments, the bottom electrode 110 and/or the top electrode 114 is/are or comprise(s) tungsten (e.g., W), tantalum nitride (e.g., TaN), titanium nitride (e.g., TiN), ruthenium (e.g., Ru), molybdenum (e.g., Mo), carbon (e.g., C), some other suitable material(s), or any combination of the foregoing. In some embodiments, a thickness of the bottom electrode 110 and/or a thickness of the top electrode 114 is/are about 100-1000 angstroms, about 100-500 angstroms, about 500-1000 angstroms, or some other suitable thickness(es).

With reference to FIG. 2, a graph 200 of some embodiments of a curve 202 describing nitrogen concentration along line A of FIG. 1 is provided for some embodiments of the IC chip of FIG. 1 in which the etch stop layer 104 is doped with nitrogen. The curve 202 increases continuously from a sidewall of the etch stop layer 104 facing away from the memory cell 102 to a midpoint between the interface 106 and a sidewall of the sidewall spacer 108 facing the memory cell 102. Further, the curve 202 decreases from the midpoint to the sidewall of the sidewall spacer 108. The nitrogen may, for example, be an acceptor dopant to reduce charge accumulation at the interface 106 for embodiments of the memory cell 102 in which negative charge and positive charge accumulate respectively in the etch stop layer 104 and the sidewall spacer 108.

With reference to FIG. 3, a top layout view 300 of some embodiments of the memory cell 102 of FIG. 1 is provided. The cross-sectional view 100 of FIG. 1 may, for example, be taken along line B, but other suitable locations are amenable. The memory cell 102, the top electrode via 118t (shown in phantom), and the sidewall spacer 108 have circular top layouts. Further, a portion of the etch stop layer 104 shown in the top layout view 300 has a circular top layout. However, note that the etch stop layer 104 overlies the sidewall spacer 108 and the memory cell 102 outside the top layout view 300 (see, e.g., FIG. 1). In alternative embodiments, the memory cell 102, the top electrode via 118t, the sidewall spacer 108, the portion of the etch stop layer 104, or any combination of the foregoing has/have other suitable top layouts.

With reference to FIGS. 4A-4H, cross-sectional views 400A-400H of some alternative embodiments of the IC chip of FIG. 1 are provided.

In FIG. 4A, the etch stop layer 104 of FIG. 1 is split into a doped etch stop layer 104a and an undoped etch stop layer 104b. The doped etch stop layer 104a is between the undoped etch stop layer 104b and the sidewall spacer 108. Further, the doped etch stop layer 104a directly contacts the sidewall spacer 108 at the interface 106.

As described above, the etch stop layer 104 may protect the sidewall spacer 108 and the data storage element 112 while performing an etch to form a via opening within which the top electrode via 118t is formed. An etchant used by the etch may have a higher etch rate for doped portions of the etch stop layer 104 than for undoped portions of the etch stop layer 104. Hence, doped portions of the etch stop layer 104 may provide less protection than undoped portions of the etch stop layer 104. Therefore, by splitting the etch stop layer 104 so the undoped etch stop layer 104b is at outer surfaces of the etch stop layer 104, and so the doped etch stop layer 104a is at inner surfaces of the etch stop layer 104, protection from the etch stop layer 104 may be maximized while still reducing charge accumulation at the interface 106.

The doped etch stop layer 104a and the undoped etch stop layer 104b are as the etch stop layer 104 is described with regard to FIG. 1, except that the doped etch stop layer 104a is doped and the undoped etch stop layer 104b is undoped. The doped etch stop layer 104a reduces charge accumulation at the interface 106, and the undoped etch stop layer 104b provides enhanced etch protection while forming the top electrode via 118t.

In some embodiments, a thickness $T_{de}$ of the doped etch stop layer 104a is about 1-10 angstroms, about 1-5 angstroms, about 5-10 angstroms, or some other suitable value. If the thickness $T_{de}$ is too small (e.g., less than about 1 angstrom), the doped etch stop layer 104a may be unable to reduce charge accumulation at the interface 106.

In some embodiments, an atomic percentage of metal in the undoped etch stop layer 104b is less than that in the doped etch stop layer 104a. For example, the atomic percentage of metal in the undoped etch stop layer 104b may be less than about 40%, 30%, or some other suitable value, whereas the atomic percentage of metal in the doped etch stop layer 104a may be more than about 40%, 50%, or some other suitable value. In some embodiments, a doping concentration of the doped etch stop layer 104a is three, five, ten, or more times a doping concentration of any impurities in the undoped etch stop layer 104b. In some embodiments, the undoped etch stop layer 104b consists essentially of a first material and the doped etch stop layer 104a consists essentially of the first material and dopants to reduce charge accumulation.

Figure 4B:
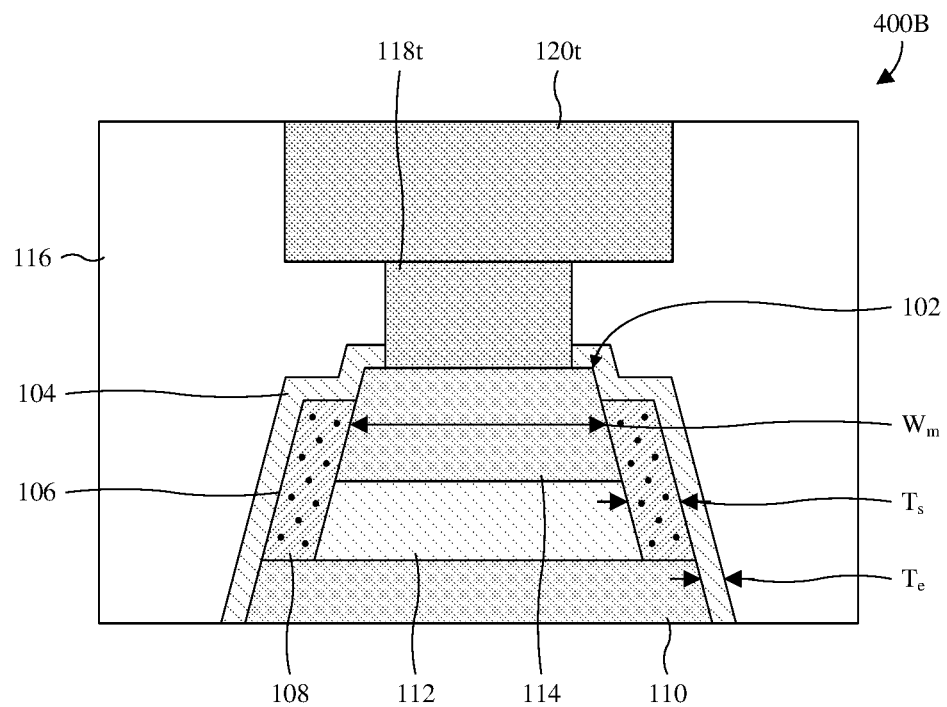

In FIG. 4B, the sidewall spacer 108 is doped (schematically illustrated by the black dots) instead of the etch stop layer 104 to reduce charge accumulation at the interface 106 between the etch stop layer 104 and a sidewall spacer 108. Hence, the etch stop layer 104 is undoped, whereas the sidewall spacer 108 is doped.

To the extent that positive charge accumulates at the interface 106 in the sidewall spacer 108, and hence negative charge accumulates at the interface 106 in the etch stop layer 104, the sidewall spacer 108 may be doped with donor dopants. To the extent that negative charge accumulates at the interface 106 in the sidewall spacer 108, and hence positive charge accumulates at the interface 106 in the etch stop layer 104, the sidewall spacer 108 may be doped with acceptor dopants. In both cases, the dopants shift an electronegativity of the sidewall spacer 108 closer to that of the etch stop layer 104, thereby reducing the charge accumulation.

As above, by reducing the charge accumulation, the doping reduces an electric field produced by the electric dipole. As such, the electric field minimally affects electrical properties of the data storage element 112. Absent the reduction, the electric field may materially degrade electrical properties of the data storage element 112. This may, in turn, lead to failure of the memory cell 102 and/or decrease manufacturing yields.

In some embodiments in which the sidewall spacer 108 is doped with donor dopants, the donor dopants are or comprise fluorine (e.g., F), chlorine (e.g., Cl), bromine (e.g., Br), some other suitable donor dopants, or any combination of the foregoing. In some embodiments in which the sidewall spacer 108 is doped with donor dopants, the sidewall spacer 108 is or comprises nitrogen-doped silicon oxide (e.g., SiON), sulfur-doped silicon nitride (e.g., SiSN), carbon-doped silicon nitride (e.g., SiNC), carbon-doped silicon phosphide (e.g., SiPC), fluorine-doped silicon oxide (e.g., SiOF), chlorine-doped silicon oxide (e.g., SiOCl), some other suitable doped material(s), or any combination of the foregoing In some embodiments, a doping concentration of the sidewall spacer 108 is three or more times a concentration of any impurities in the sidewall spacer 108 before the doping and/or three or more times a concentration of any impurities in the etch stop layer 104. In some embodiments, a charging voltage of the sidewall spacer 108 is less than it would otherwise be if undoped. As with the etch stop layer 104, the charging voltage may, for example, be determined by a QUANTOX process tool or some other suitable process tool.

Figure 4C:
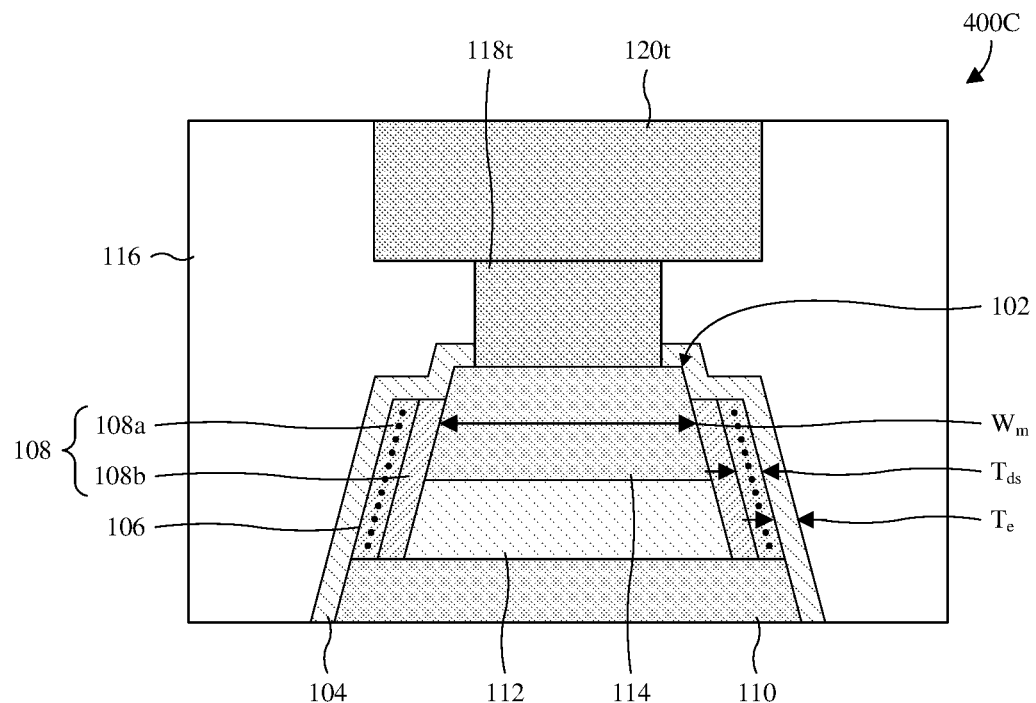

In FIG. 4C, the sidewall spacer 108 is doped (schematically illustrated by the black dots) instead of the etch stop layer 104 as in FIG. 4B. Further, the sidewall spacer 108 of FIG. 4B is split into a doped sidewall spacer 108a and an undoped sidewall spacer 108b. The doped sidewall spacer 108a is between the undoped sidewall spacer 108b and the etch stop layer 104. Further, the doped sidewall spacer 108a directly contacts the etch stop layer 104 at the interface 106.

As described above, an etchant used to form a via opening within which the top electrode via 118t is formed may be corrosive of the sidewall spacer 108 and the data storage element 112. The etch stop layer 104 protects the sidewall spacer 108 and the data storage element 112. However, to the extent that the etch stop layer 104 fails, the sidewall spacer 108 may be a last line of protection for the data storage element 112.

The etchant may have a higher etch rate for doped portions of the sidewall spacer 108 than for undoped portion of the sidewall spacer 108. Hence, doped portions of the sidewall spacer 108 may provide less protection to the data storage element 112 than undoped portions of the sidewall spacer 108. Therefore, by splitting the sidewall spacer 108 so the undoped sidewall spacer 108b is at the data storage element 112 and so the doped sidewall spacer 108a is at the interface 106, protection of the data storage element 112 by the sidewall spacer 108 may be maximized while still reducing charge accumulation at the interface 106.

The doped sidewall spacer 108a and the undoped sidewall spacer 108b are as the sidewall spacer 108 is described with regard to FIGS. 1 and 4B, except that the doped sidewall spacer 108a is doped and the undoped sidewall spacer 108b is undoped. The doped sidewall spacer 108a reduces charge accumulation at the interface 106, and the undoped sidewall spacer 108b provides enhanced etch protection while forming the top electrode via 118t.

In some embodiments, a thickness $T_{ds}$ of the doped sidewall spacer 108a is about 10-100 angstroms, about 10-50 angstroms, about 50-100 angstroms, or some other suitable value. If the thickness $T_{ds}$ is too small (e.g., less than about 50 angstroms), the doped sidewall spacer 108a may be unable to reduce charge accumulation at the interface 106.

In some embodiments, a doping concentration of the doped sidewall spacer 108a is three, five, ten, or more times a doping concentration of any impurities in the undoped sidewall spacer 108b. In some embodiments, the undoped sidewall spacer 108b consists essentially of a first material and the doped sidewall spacer 108a consists essentially of the first material and dopants to reduce charge accumulation.

Figure 4D:
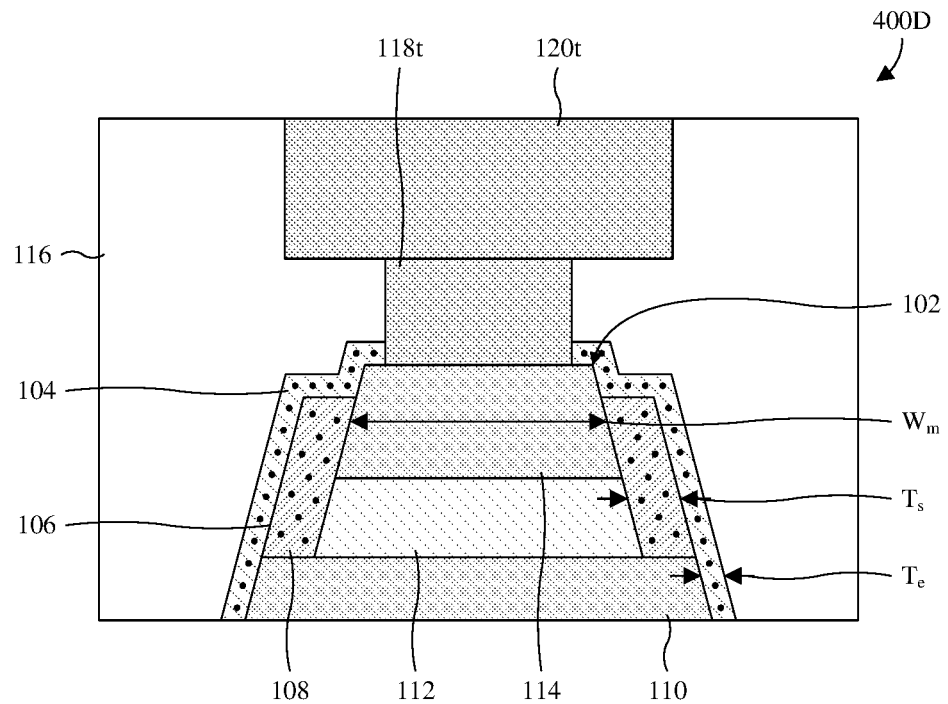

In FIG. 4D, the sidewall spacer 108 is also doped (schematically illustrated by the black dots) to reduce charge accumulation at the interface 106 between the etch stop layer 104 and a sidewall spacer 108. Hence, the etch stop layer 104 and the sidewall spacer 108 are both doped. The etch stop layer 104 may, for example, be doped as described with regard to FIG. 1, whereas the sidewall spacer 108 may, for example, be doped as described with regard to FIG. 4B.

Figure 4E:
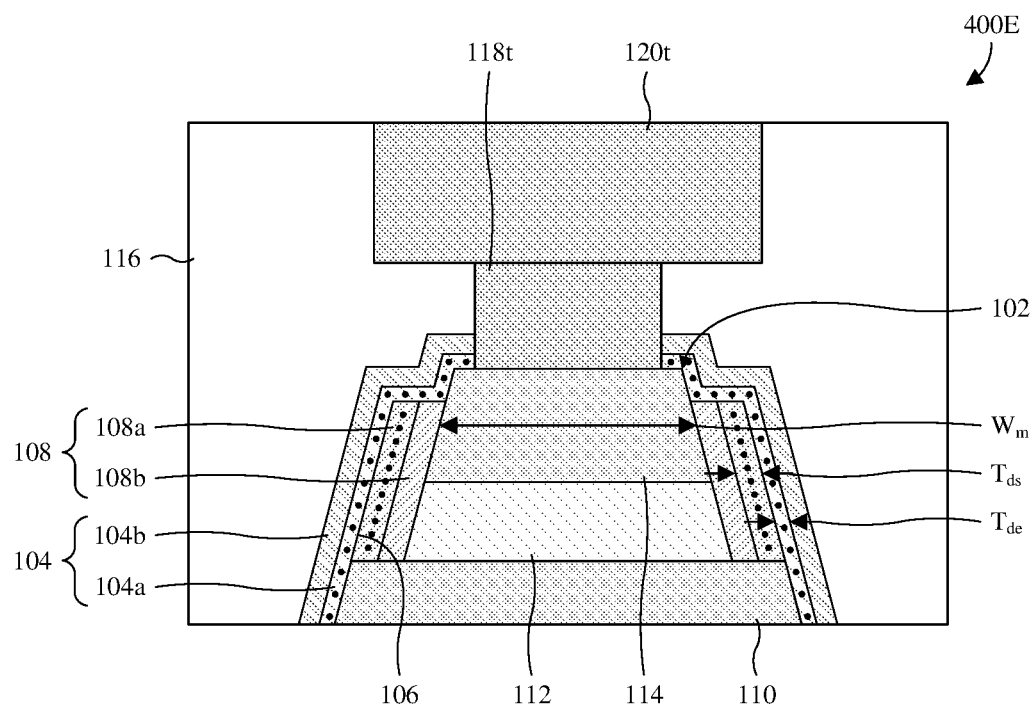

In FIG. 4E, the etch stop layer 104 is split into the doped etch stop layer 104a and the undoped etch stop layer 104b as described with regard to FIG. 4A. Further, the sidewall spacer 108 is split into the doped sidewall spacer 108a and the undoped sidewall spacer 108b as described with regard to FIG. 4C.

Figure 4F:
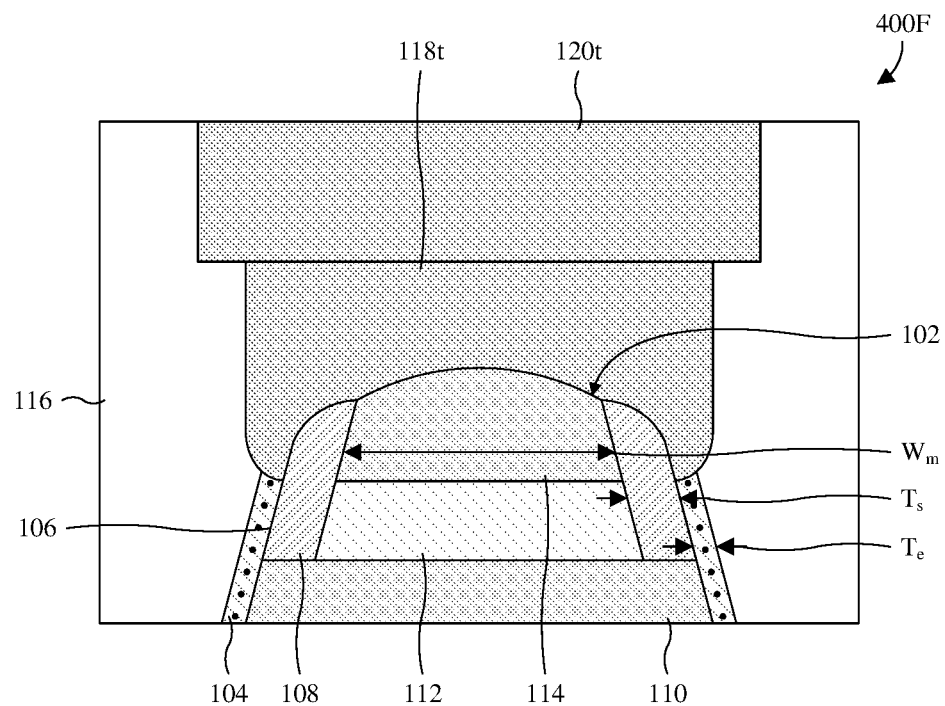

In FIG. 4F, top surfaces of the sidewall spacer 108 and the top electrode 114 are curved. Further, a bottom surface of the top electrode via 118t wraps around a top of the memory cell 102 and extends along sidewalls of the sidewall spacer 108. As such, the etch stop layer 104 underlies the top electrode via 118t and does not extends along a top surface of the sidewall spacer 108 or a top surface of the top electrode 114.

Figure 4G:
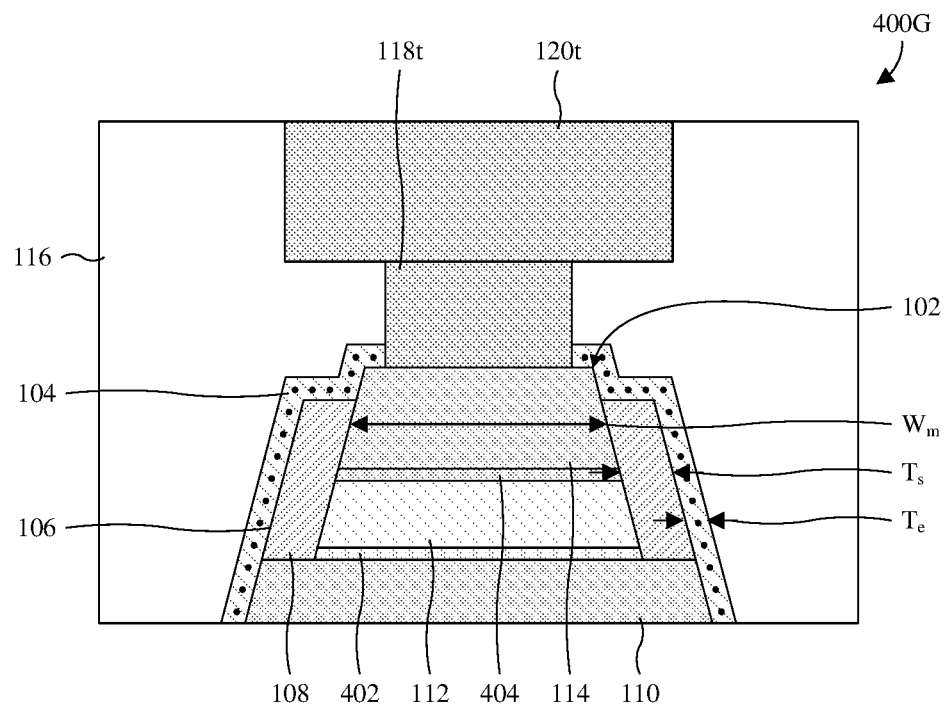

In FIG. 4G, the memory cell 102 comprises a first seed layer 402 between the bottom electrode 110 and the data storage element 112 and further comprises a second seed layer 404 between the data storage element 112 and the top electrode 114. The first seed layer 402 may serve as a crystalline seed while epitaxially growing or otherwise depositing the data storage element 112, whereas the second seed layer 404 may serve as a crystalline seed while epitaxially growing or otherwise depositing the top electrode 114.

In some embodiments, the bottom electrode 110 is or comprises titanium nitride at an interface at which the bottom electrode 110 directly contacts the first seed layer 402 and the first seed layer 402 is or comprises tantalum nitride. Other suitable materials are, however, amenable. In some embodiments, the top electrode 114 is or comprises tungsten at an interface at which the top electrode 114 directly contacts the second seed layer 404 and the second seed layer 404 is or comprises ruthenium. Other suitable materials are, however, amenable.

Figure 4H:
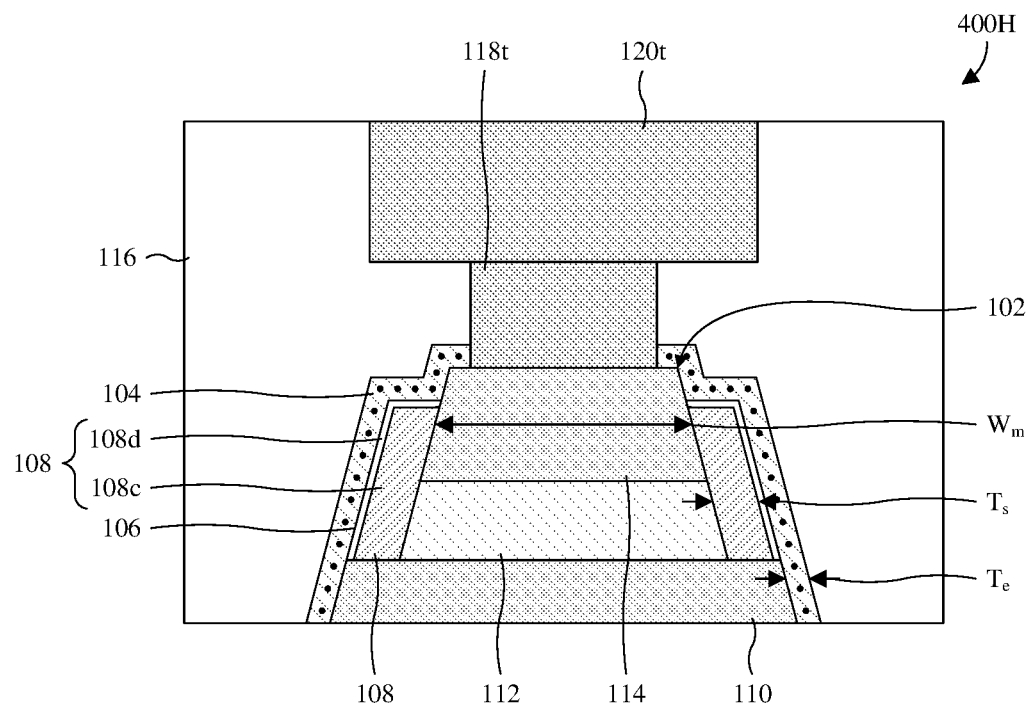

In FIG. 4H, the sidewall spacer 108 comprise a sidewall spacer body 108c and a native oxide layer 108d lining the sidewall spacer body 108c at the interface 106. The sidewall spacer body 108c is as the sidewall spacer 108 is described with regard to FIG. 1, whereas the native oxide layer 108d is native oxide of the sidewall spacer body 108c. In some embodiments, the sidewall spacer body 108c is devoid of, or substantially devoid of, oxygen. In some embodiments, the sidewall spacer body 108c is or comprises silicon nitride (e.g., $SiN_x$), silicon carbide (e.g., SiC), some other suitable material(s) without oxygen, or any combination of the foregoing, and/or the native oxide layer 108d is or comprises silicon oxynitride, silicon oxycarbide, some other suitable material(s) with oxide, or any combination of the foregoing.

While FIGS. 4F-4H describe variations to embodiments of the IC chip in FIG. 1, the variations may also be applied to embodiments of the IC chip in any of FIGS. 4A-4E. For example, the sidewall spacer 108 of FIG. 4A may comprise the sidewall spacer body 108c and the native oxide layer 108d of FIG. 4H. Similarly, while FIGS. 4A-4E describe variations to embodiments of the IC chip of FIG. 1, the variation may also be applied to embodiments of the IC chip in any of FIGS. 4F-4H. For example, the sidewall spacer 108 of FIG. 4H may be doped as in FIG. 4B and/or split into the doped sidewall spacer 108a and the undoped sidewall spacer 108b as in FIG. 4C.

Figure 5:
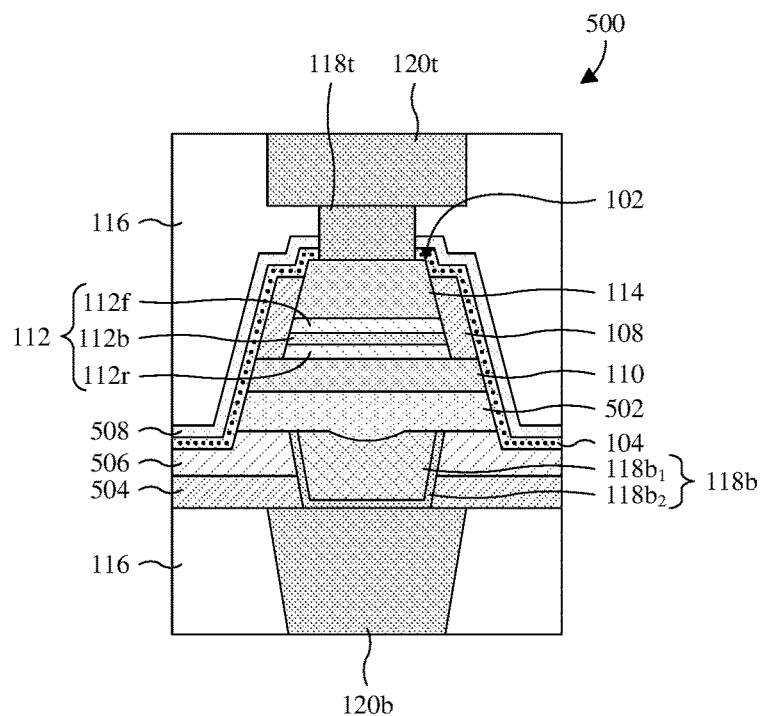
FIG. 5 illustrates an expanded cross-sectional view of some more detailed embodiments of the IC chip of FIG. 1.

With reference to FIG. 5, an expanded cross-sectional view 500 of some more detailed embodiments of the IC chip of FIG. 1 is provided. The memory cell 102 overlies a bottom electrode wire 120b and is electrically coupled to the bottom electrode wire 120b through a bottom electrode via 118b and a bottom electrode barrier 502.

The bottom electrode barrier 502 underlies the memory cell 102 on a bottom surface of the bottom electrode 110 and forms a common sidewall with the bottom electrode 110 and the sidewall spacer 108. Further, the bottom electrode barrier 502 is configured to block diffusion of material from under the memory cell 102 to the memory cell 102. For example, the bottom electrode barrier 502 may be configured to block copper or other suitable material, which may diffuse towards the memory cell 102 from the bottom electrode wire 120b or some other suitable structure underlying the memory cell 102. Diffusion of material to the memory cell 102 could change electrical properties of the memory cell 102, thereby degrading performance of the memory cell 102 and/or degrading bulk manufacturing yields.

The bottom electrode via 118b is between the bottom electrode barrier 502 and the bottom electrode wire 120b and extends from the bottom electrode barrier 502 to the bottom electrode wire 120b through a first via dielectric layer 504 and a second via dielectric layer 506. Further, the bottom electrode via 118b comprises a conductive body 118$b_1$ and a conductive liner 118$b_2$. The conductive liner 118$b_2$ cups an underside of the conductive body 118$b_1$ and extends along a bottom surface and sidewalls of the conductive body 118$b_1$.

In some embodiments, the conductive liner 118$b_2$ is configured to enhance adhesion between the first and second via dielectric layers 504, 506 and the conductive body 118$b_1$. Further, in some embodiments, the conductive liner 118$b_2$ is configured to block diffusion of material from under the bottom electrode via 118b to the memory cell 102 similar to the bottom electrode barrier 502. As described above, diffusion to the memory cell 102 could degrade performance of the memory cell 102 and/or degrade bulk manufacturing yields.

The first and second via dielectric layers 504, 506 are different materials and separate the IMD layer 116 into a lower portion and an upper portion. Further, a buffer layer 508 separates the etch stop layer 104 from the upper portion of the IMD layer 116. In alternative embodiments, the first via dielectric layer 504 is omitted or the second via dielectric layer 506 is omitted. Further, in alternative embodiments, the buffer layer 508 is omitted.

The data storage element 112 is a MTJ element and comprises a free element 112f, a reference element 112r, and a barrier element 112b. In alternative embodiments, the data storage element 112 is a ferroelectric element or some other suitable data storage element. The free element 112f and the reference element 112r have individual magnetizations. The magnetization of the free element 112f is free to change, whereas the magnetization of the reference element 112r is fixed. When the magnetizations are parallel, carriers may tunnel through the barrier element 112b and the memory cell 102 may have a low resistance state. When the magnetizations are antiparallel, carriers may be less likely to tunnel through the barrier element and the memory cell 102 may be in a high resistance state. Depending on whether the memory cell 102 is in the high or low resistance state, the memory cell 102 stores a binary "1" or "0". In some embodiments, the barrier element 112b is or comprises magnesium oxide and/or some other suitable material(s).

In some embodiments, the bottom electrode barrier 502 is or comprise tantalum nitride (e.g., TaN), titanium nitride (e.g., TiN), tungsten nitride (e.g., WN), tungsten carbon nitride (e.g., WCN), molybdenum nitride (e.g., MoN), some other suitable material(s), or any combination of the foregoing. In some embodiments, a thickness of the bottom electrode barrier 502 is about 10-200 angstroms or some other suitable value. In some embodiments, the top surface of the conductive body 118$b_1$ has a concave recess at the interface between the conductive body 118$b_1$ and the bottom electrode barrier 502. In some embodiments, the whole top surface of the conductive body 118$b_1$ may be substantially level with the top surface of the second via dielectric layer 506.

In some embodiments, the first via dielectric layer 504 is or comprises silicon carbide (e.g., SiC), silicon oxycarbide (e.g., SiOC), tantalum oxycarbide (e.g., TaOC), aluminum oxycarbide (e.g., AlOC), some other suitable carbide(s) or other material(s), or any combination of the foregoing. In some embodiments, the second via dielectric layer 506 is or comprises silicon oxide (e.g., $SiO_x$), aluminum oxide (e.g., $AlO_x$), tantalum oxide (e.g., $TaO_x$), hafnium oxide ($HfO_x$), zirconium oxide (e.g., $ZrO_x$), silicon oxycarbide (e.g., SiOC), some other suitable oxide(s) or other material(s), or any combination of the foregoing. In some embodiments, a thickness of the first via dielectric layer 504 and/or a thickness of the second via dielectric layer 506 is/are about 50-500 angstroms or some other suitable value.

Figure 6A:
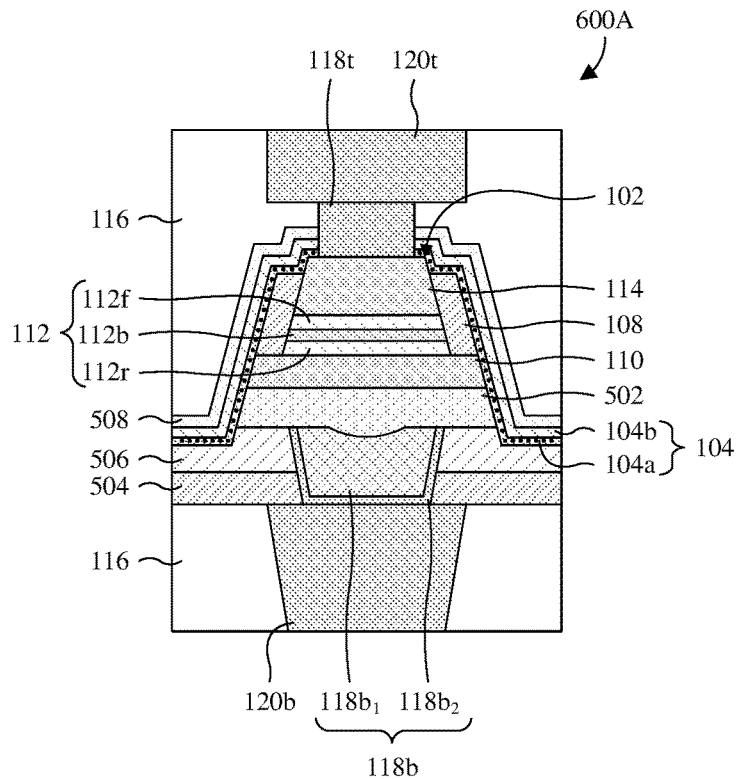
FIGS. 6A-6C illustrate cross-sectional views of some alternative embodiments of the IC chip of FIG. 5.
Figure 6B:
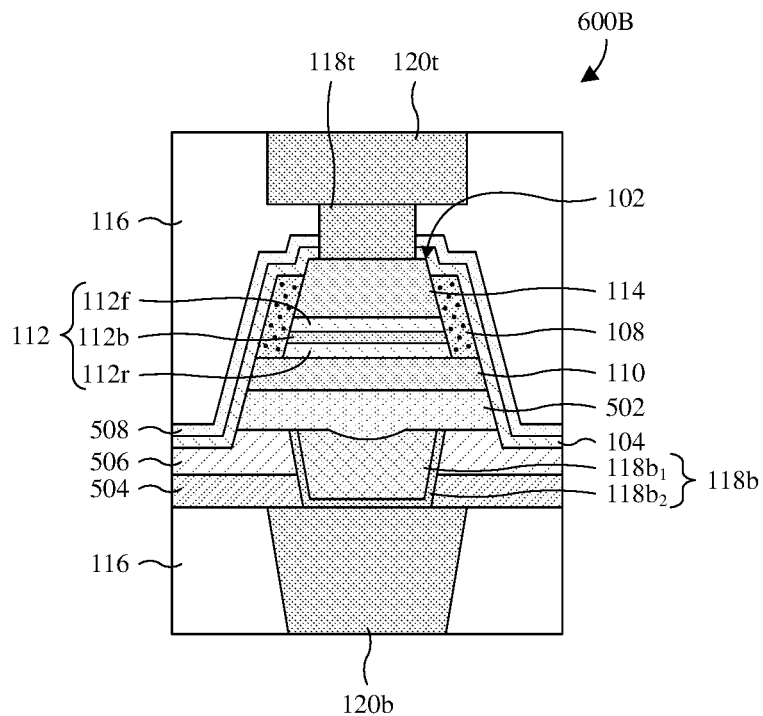
Figure 6C:
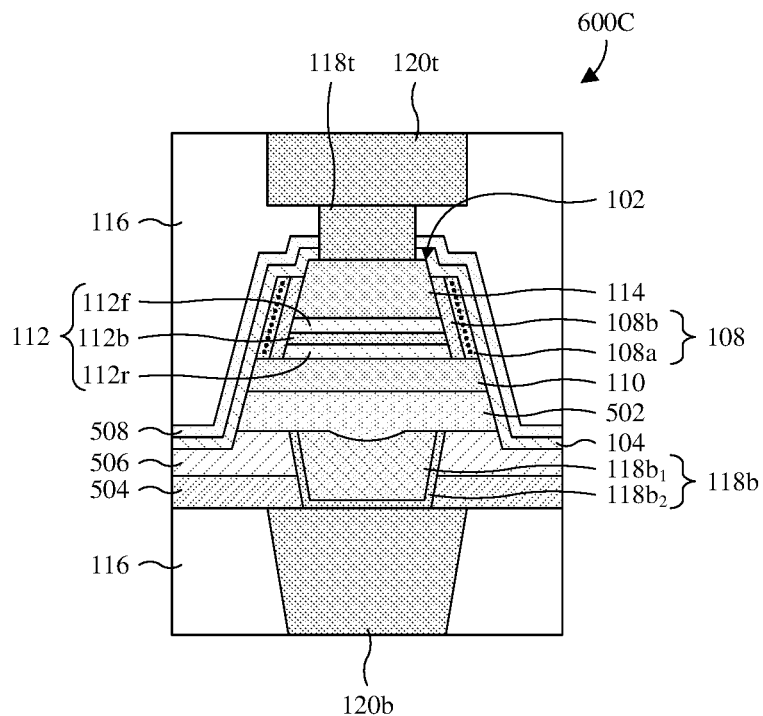

While FIG. 5 uses embodiments of the sidewall spacer 108 and the etch stop layer 104 as in FIG. 1, embodiments of the sidewall spacer 108 and the etch stop layer 104 as in any of FIGS. 4A-4H are amenable. For example, FIGS. 6A-6C provide cross-sectional views 600A-600C of some alternative embodiments of the IC chip of FIG. 5 in which embodiments of the sidewall spacer 108 and the etch stop layer 104 as in FIGS. 4A-4C are respectively used.

Figure 7A:
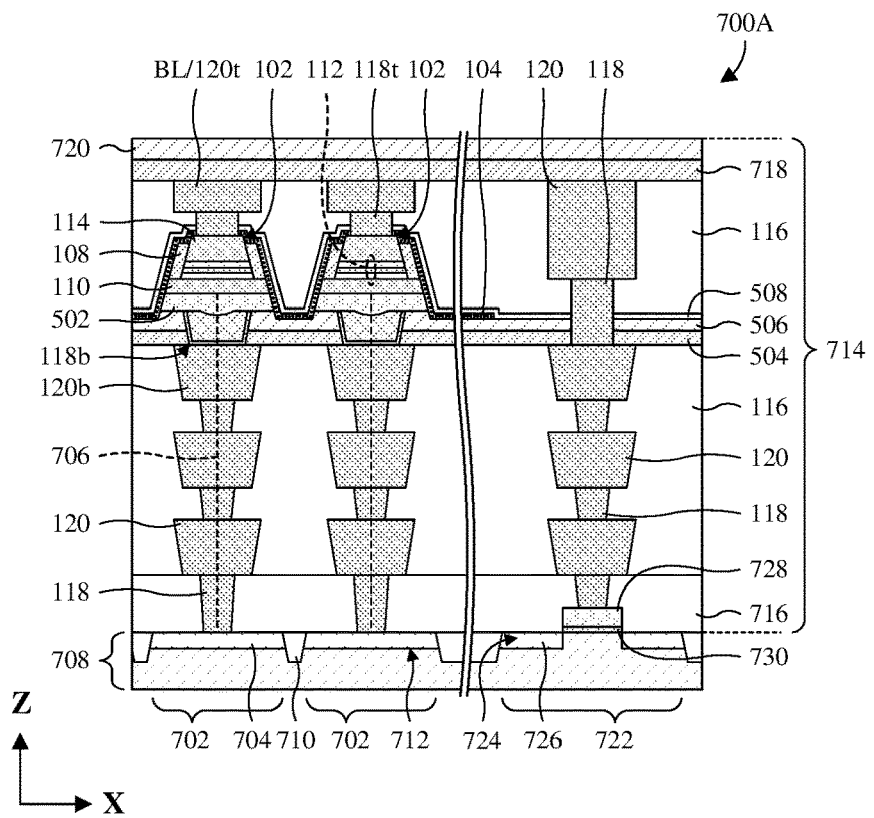
FIGS. 7A and 7B illustrate cross-sectional views of some embodiments of an IC chip comprising memory cells which are integrated into individual one-transistor one-resistor (1T1R) cells and in which an etch stop layer is doped to reduce charge accumulation.

With reference to FIG. 7A, a cross-sectional view 700A of some embodiments of an IC chip comprising memory cells 102 are provided, where the memory cells 102 are integrated into individual one-transistor one-resistor (1T1R) cells 702 and in which an etch stop layer 104 is doped to reduce charge accumulation. Each of the memory cells 102, and corresponding sidewall spacers 108 and the etch stop layer 104, are as their counterparts are described with regard to FIG. 5.

The 1T1R cells 702 comprise individual drain regions 704 and individual drain-side conductive paths 706. The drain regions 704 are doped regions of a substrate 708 and each has an opposite doping type as an adjoining region of the substrate 708. Further, the drain regions 704 are electrically separated from each other by a trench isolation structure 710 and partially surround or define access transistors 712 (partially shown) used to individually select the memory cells 102. The trench isolation structure 710 extends into a top of the substrate 708 and comprises silicon oxide and/or some other suitable dielectric material(s). The substrate 708 may, for example, be a bulk silicon substrate or some other suitable semiconductor substrate.

The drain-side conductive paths 706 electrically couple the drain regions 704 to the memory cells 102. Further, the drain-side conductive paths 706 are formed by an interconnect structure 714 within which the memory cells 102 are arranged. The interconnect structure 714 comprises a plurality of wires 120 and a plurality of vias 118. The plurality of wires 120 comprises top electrode wires 120t and bottom electrode wires 120b. In some embodiments, the top electrode wires 120t correspond to bit lines BL. The plurality of vias 118 comprises top electrode vias 118t. A level of the vias 118 nearest the substrate 708 is in an interlayer dielectric (ILD) layer 716, whereas remaining levels of the vias 118 and the wires 120 are in an IMD layer 116. Further, a plurality of vias 118 and the plurality of wires 120 are covered by a first passivation layer 718 and a second passivation layer 720. The wires 120 and the vias 118 may be or comprise, for example, copper, aluminum, some other suitable metal(s), or any combination of the foregoing.

A peripheral region 722 to a side of the 1T1R cells 702 accommodates peripheral devices 724 (only one of which is shown). The peripheral devices 724 may, for example, be metal-oxide-semiconductor field-effect transistors (MOSFETs), fin field-effect transistors (finFETs), gate-all-around field-effect transistors (GAA FETs), or some other suitable type of semiconductor device. Each of the peripheral devices 724 comprises a pair of source/drain regions 726 in the substrate 708, a gate electrode 728, and a gate dielectric layer 730. The gate electrode 728 and the gate dielectric layer 730 are stacked between the source/drain regions 726, such that the gate dielectric layer 730 separates the gate electrode 728 from the substrate 708.

Figure 7B:
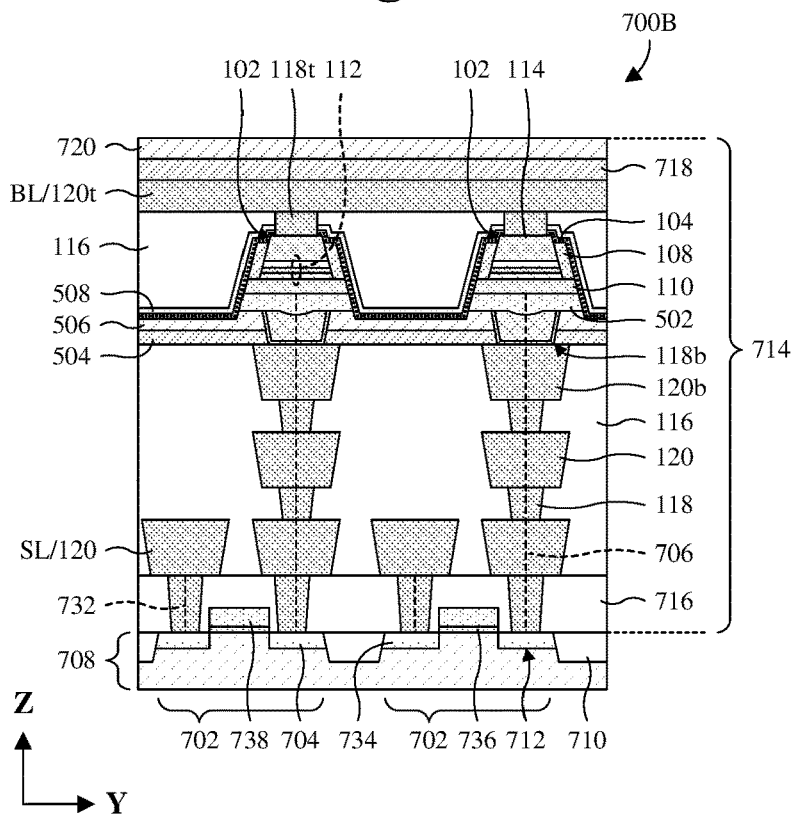

With reference to FIG. 7B, a cross-sectional view 700B of some embodiments of the IC chip of FIG. 7A is provided along an axis orthogonal to that which the cross-sectional view 700A of FIG. 7A is taken. The 1T1R cells 702 comprise individual memory cells 102, individual drain-side conductive paths 706, individual access transistors 712, and individual source-side conductive paths 732. Each of the memory cells 102, and corresponding sidewall spacers 108 and the etch stop layer 104, are as their counterparts are described with regard to FIG. 5.

The access transistors 712 are on the substrate 708, between the substrate 708 and the interconnect structure 714, and are electrically separated by the trench isolation structure 710. The access transistors 712 comprise individual drain regions 704, individual source regions 734, individual gate dielectric layers 736, and individual gate electrodes 738. The gate electrodes 738 respectively overlie the gate dielectric layers 736 and, in some embodiments, form word lines. The drain and source regions 704, 734 are doped regions of the substrate 708 and each has an opposite doping type as an adjoining region of the substrate 708. The drain regions 704 respectively border drain sides of the gate electrodes 738, and the source regions 734 respectively border source sides of the gate electrodes 738. The access transistors 712 may, for example, be MOSFETs, finFETs, GAA FETs, or some other suitable type of semiconductor device.

The drain-side conductive paths 706 electrically couple the drain regions 704 to the memory cells 102, and the source-side conductive paths 732 electrically couple the source regions 734 to source lines SL. The drain-side and source-side conductive paths 706, 732 are formed by the plurality of wires 120 and the plurality of vias 118.

Figure 8:
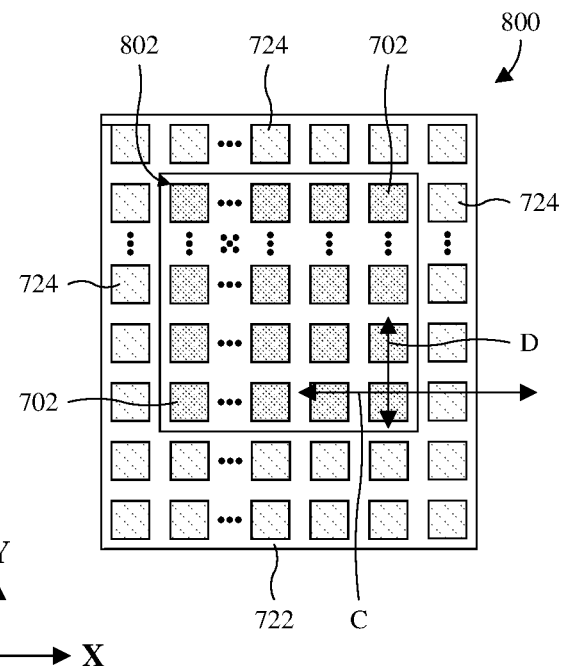
FIG. 8 illustrates a top layout view of some embodiments of the IC chip of FIGS. 7A and 7B.

With reference to FIG. 8, a top layout view 800 of some embodiments of the IC chip of FIGS. 7A and 7B is provided. The cross-sectional views 700A, 700B of FIGS. 7A and 7B may, for example, respectively be taken along lines C and D or other suitable locations. The IC chip comprises a plurality of 1T1R cells 702 in a plurality of rows and a plurality of columns, thereby forming a memory array 802. Peripheral devices 724 surround the memory array 802 at a peripheral region 722 of the IC chip. The peripheral devices 724 may, for example, implement read/write circuitry and/or other suitable circuitry for operating the 1T1R cells 702.

Figure 9:
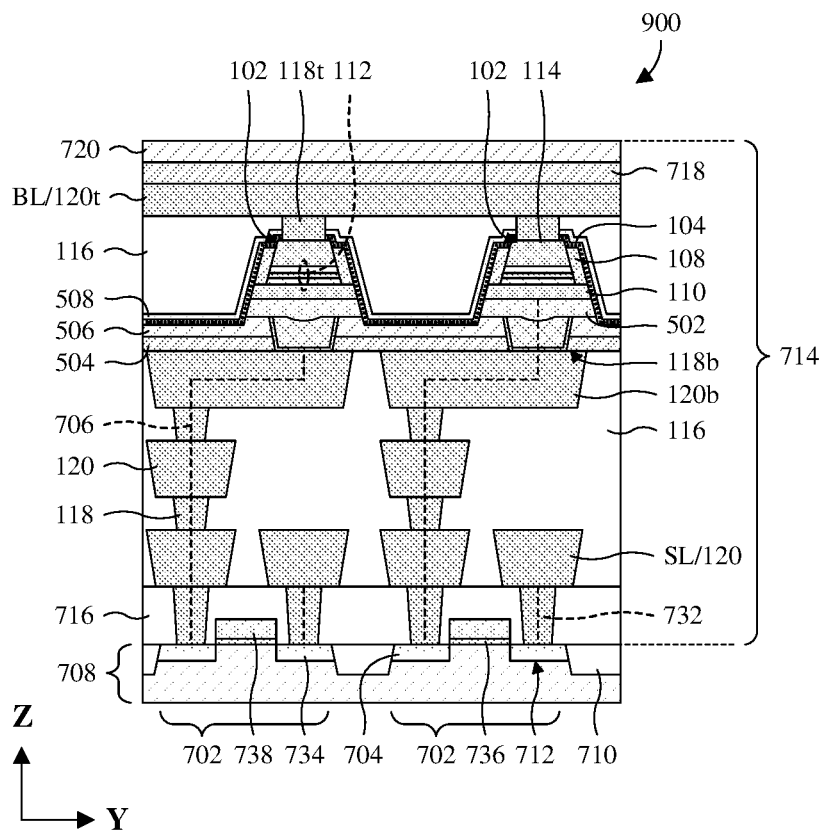
FIG. 9 illustrates a cross-sectional view of some alternative embodiments of the IC chip of FIG. 7B.

With reference to FIG. 9, a cross-sectional view 900 of some alternative embodiments of the IC chip of FIG. 7B is provided in which locations of the drain regions 704 and the source regions 734 are swapped. Further, the memory cells 102 overlie the source regions 734 as opposed to the drain regions 704.

While FIGS. 7A, 7B, and 9 are illustrated using memory-cell embodiments, sidewall-spacer embodiments, and etch-stop-layer embodiments as in FIG. 5, embodiments as in any one or combination of FIGS. 1-3, 4A-4H, and 6A-6C may alternatively be used. For example, etch-stop-layer embodiments as in FIG. 4A may alternatively be used for the etch stop layer 104 in FIGS. 7A, 7B, and 9, such that the etch stop layer 104 comprises a doped etch stop layer 104a and an undoped etch stop layer 104b. As another example, sidewall-spacer embodiments as in FIG. 4C may alternatively be used for the sidewall spacers 108 in FIGS. 7A, 7B, and 9, such that the sidewall spacers 108 comprise individual doped sidewall spacers 108a and individual undoped sidewall spacers 108b.

With reference to FIGS. 10-15, 16A, 16B, and 17-23, a series of cross-sectional views 1000-1500, 1600A, 1600B, and 1700-2300 of some embodiments of a method for forming an IC chip comprising memory cells which are integrated into individual 1T1R cells and in which an etch stop layer is doped to reduce charge accumulation. The cross-sectional views 1000-1500, 1600A, 1600B, and 1700-2300 may, for example, correspond to FIG. 7A and hence may, for example, illustrate formation of the IC chip of FIGS. 7A and 7B. Further, the cross-sectional views 1000-1500, 1600A, 1600B, and 1700-2300 may, for example, be taken along line C in FIG. 8.

Figure 10:
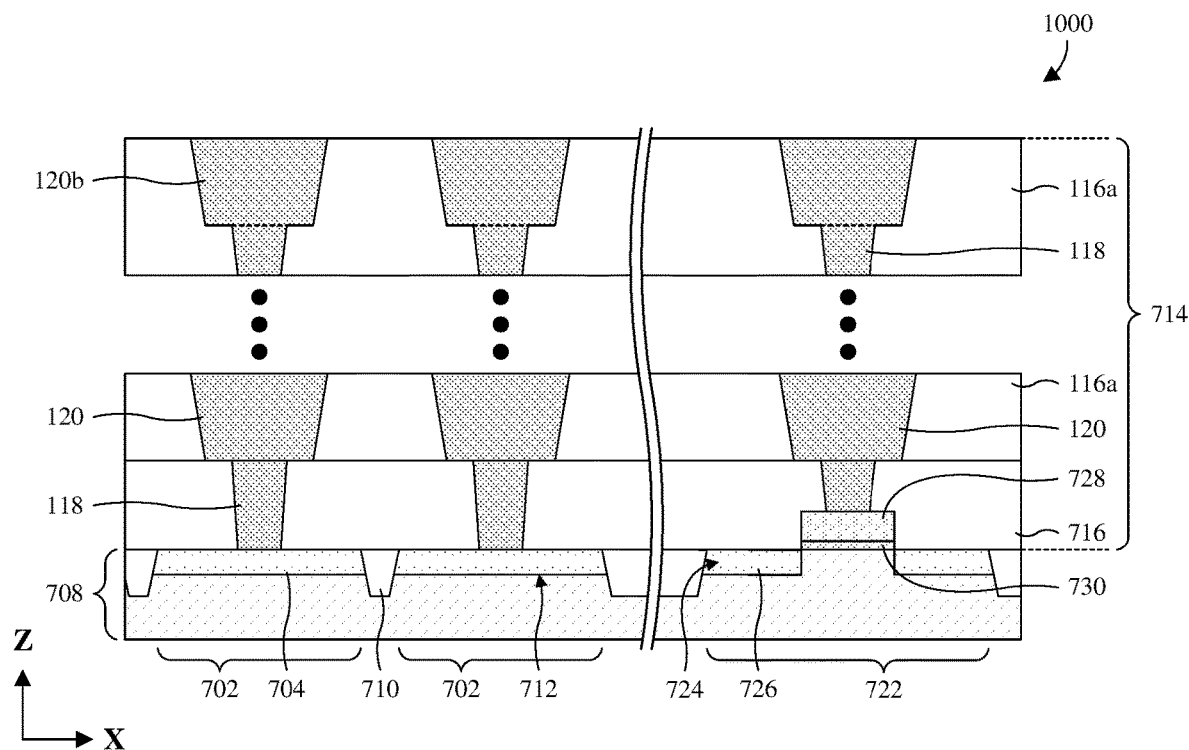
FIGS. 10-15, 16A, 16B, and 17-23 illustrate a series of cross-sectional views of some embodiments of a method for forming an IC chip comprising memory cells which are integrated into individual 1T1R cells and in which an etch stop layer is doped to reduce charge accumulation.

As illustrated by the cross-sectional view 1000 of FIG. 10, an interconnect structure 714 is partially formed over and electrically coupled to a plurality of access transistors 712 (only partially shown) and a peripheral device 724. The access transistors 712 are individual to and respectively at a plurality of 1T1R cells 702 being formed, and the peripheral device 724 is at a peripheral region 722 of the IC chip being formed. The access transistors 712 and the peripheral device 724 are on and partially formed by a substrate 708 and are separated by a trench isolation structure 710 extending into the substrate 708. The access transistors 712 and the peripheral device 724 may, for example, be as described with regard to FIGS. 7A and 7B.

The interconnect structure 714 comprises a plurality of wires 120 and a plurality of vias 118 that are stacked in a dielectric structure. The dielectric structure comprises an ILD layer 716 and a first IMD layer 116a over the ILD layer 716. The plurality of wires 120 comprises a plurality of bottom electrode wires 120b along a top surface of the interconnect structure 714. The bottom electrode wires 120b are individual to and respectively at the 1T1R cells 702 being formed. Further, the bottom electrode wires 120b are respectively electrically coupled to drain regions 704 of the access transistors 712 by underlying wires and vias.

Figure 11:
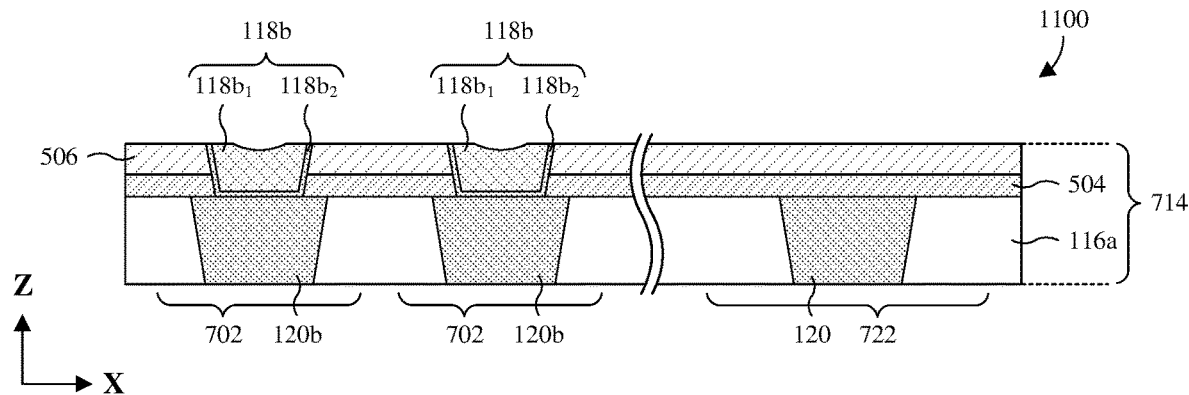

As illustrated by the cross-sectional view 1100 of FIG. 11, a first via dielectric layer 504 and a second via dielectric layer 506 are deposited or otherwise formed on the interconnect structure 714. Note that for drawing compactness, a lower portion of the interconnect structure 714 is omitted herein and in subsequent figures. The first via dielectric layer 504 may, for example, be or comprise silicon carbide and/or some other suitable dielectric(s), and/or the second via dielectric layer 506 may, for example, be or comprise silicon-rich oxide and/or some other suitable dielectric(s). Further, the first via dielectric layer 504 may, for example, have a thickness of about 250 angstroms, about 100-1000 angstroms, or some other suitable value, and/or the second via dielectric layer 506 may, for example, have a thickness of about 200 angstroms, about 100-1000 angstroms, or some other suitable value. In alternative embodiments, the first via dielectric layer 504 or the second via dielectric layer 506 is omitted.

Also illustrated by the cross-sectional view 1100 of FIG. 11, bottom electrode vias 118b are formed extending through the first and second via dielectric layers 504, 506 respectively to the bottom electrode wires 120b. The bottom electrode vias 118b comprise individual conductive bodies $118b_1$ and individual conductive liners $118b_2$ respectively cupping undersides of the conductive bodies $118b_1$. The conductive liners $118b_2$ may, for example, be configured as diffusion barriers for material of the bottom electrode wires 120b.

Figure 12:
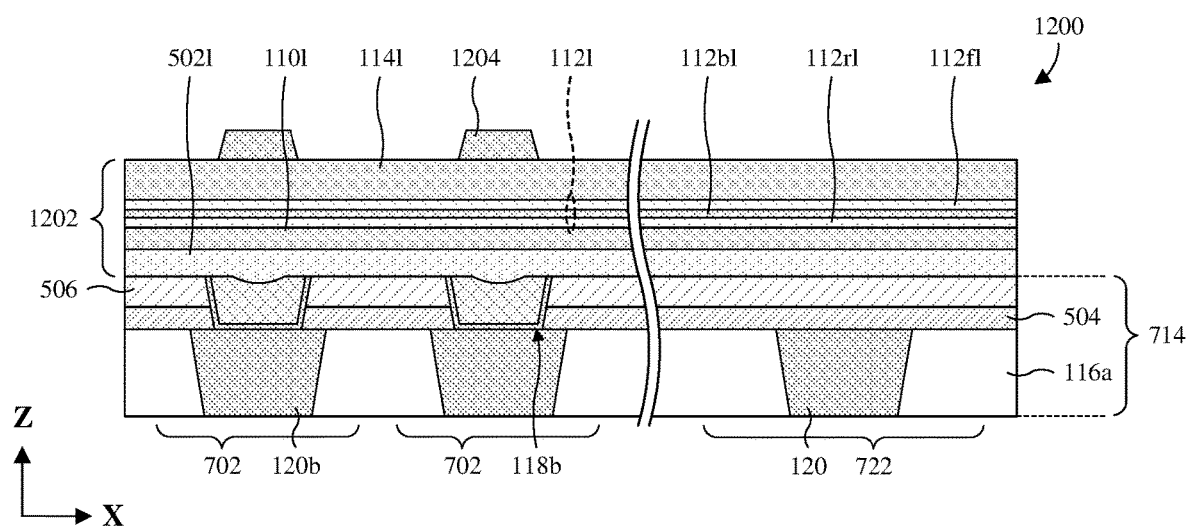

As illustrated by the cross-sectional view 1200 of FIG. 12, a memory layer 1202 is deposited over the bottom electrode vias 118b and the first and second via dielectric layers 504, 506. The memory layer 1202 comprises a bottom electrode barrier layer 502l, a bottom electrode layer 110l over the bottom electrode barrier layer 502l, a data storage layer 112l over the bottom electrode layer 110l, and a top electrode layer 114l over the data storage layer 112l. The data storage layer 112l forms a MTJ comprising a reference layer 112rl, a barrier layer 112bl, and a free layer 112fl. The reference layer 112rl, the barrier layer 112bl, and the free layer 112fl may, for example, respectively be as the reference element 112r, the barrier element 112b, and the free element 112f are described with regard to FIG. 5. The bottom electrode barrier layer 502l is configured to block diffusion of material from the bottom electrode vias 118b to the data storage layer 112l. The data storage layer 112l is configured to store data and, while described as forming an MTJ, may alternatively form or otherwise be some other suitable type of data storage layer.

Also illustrated by the cross-sectional view 1200 of FIG. 12, hard masks 1204 individual to and respectively at the 1T1R cells 702 are formed. As seen hereafter, the hard masks 1204 have patterns for memory cells of the 1T1R cells 702. The hard masks 1204 may, for example, be formed by depositing a hard mask layer over the top electrode layer 114l and subsequently patterning the hard mask layer into the hard masks 1204. The patterning may, for example, be performed by a photolithography/etching process or some other suitable patterning process.

Figure 13:
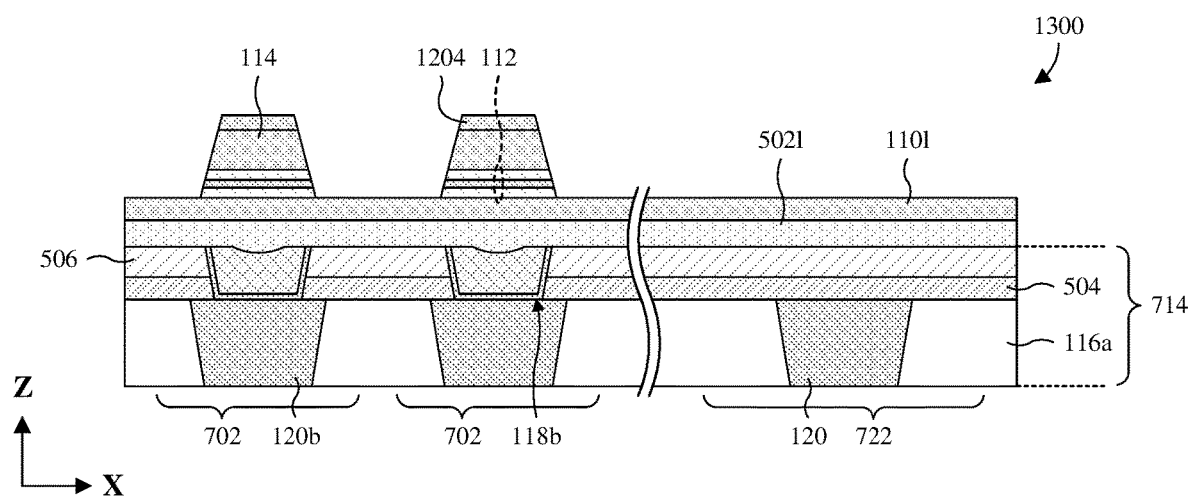

As illustrated by the cross-sectional view 1300 of FIG. 13, a first etch is performed into the top electrode layer 114l (see, e.g., FIG. 12) and the data storage layer 112l (see, e.g., FIG. 12) with the hard masks 1204 in place. The first etch stops on the bottom electrode layer 110l and transfers patterns of the hard masks 1204 to the top electrode layer 114l and the data storage layer 112l to respectively form top electrodes 114 and data storage elements 112 individual to and respectively at the 1T1R cells 702 being formed. Further, the first etch erodes the hard masks 1204, thereby reducing a thickness of the hard masks 1204.

Figure 14:
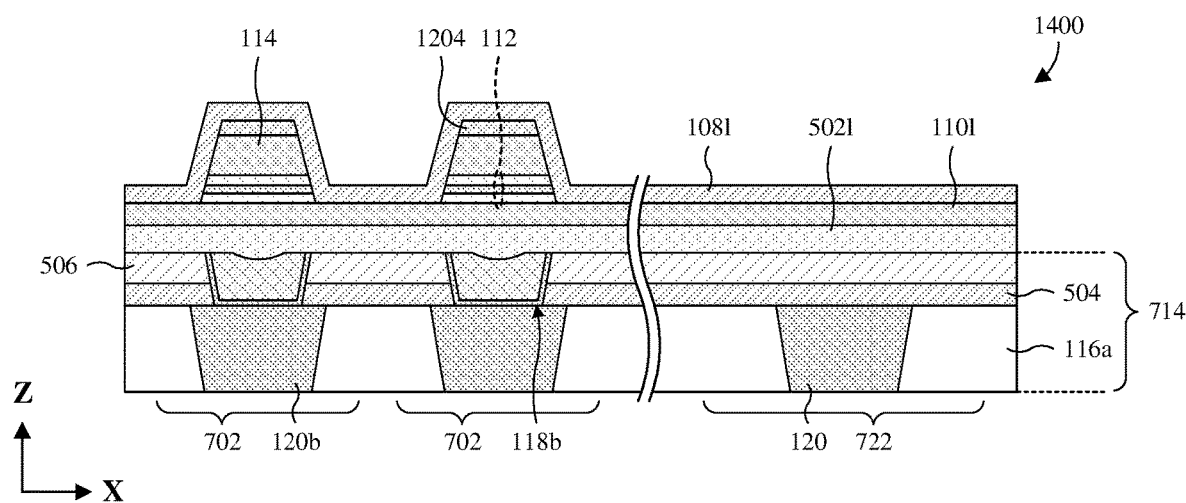

As illustrated by the cross-sectional view 1400 of FIG. 14, a sidewall spacer layer 108l is deposited covering the hard masks 1204 and the bottom electrode layer 110l and further lining common sidewalls formed by the hard masks 1204, the top electrodes 114, and the data storage elements 112. Further, the sidewall spacer layer 108l is undoped and may, for example, be deposited by atomic layer deposition (ALD) and/or some other suitable deposition process(es). The sidewall spacer layer 108l may, for example, be or comprise silicon nitride, silicon carbide, silicon oxycarbide, silicon oxynitride, silicon oxide, some other suitable dielectric(s), or any combination of the foregoing.

Figure 15:
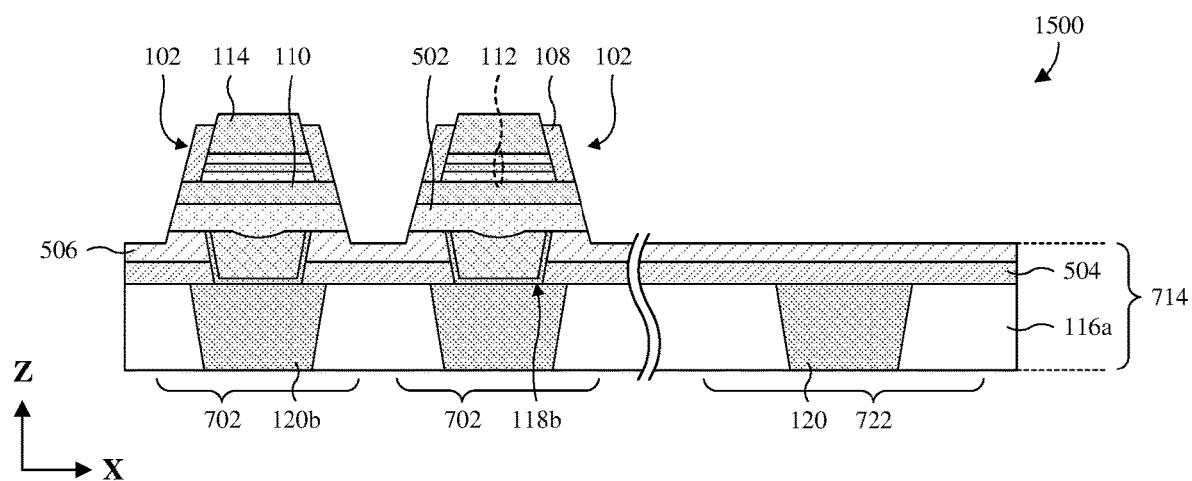

As illustrated by the cross-sectional view 1500 of FIG. 15, a second etch is performed into the sidewall spacer layer 108l (see, e.g., FIG. 14). The second etch etches back the sidewall spacer layer 108l to clear horizontal segments of the sidewall spacer layer 108l and to form sidewall spacers 108 lining the common sidewalls formed by the data storage elements 112, the top electrodes 114, and the hard masks 1204.

Also illustrated by the cross-sectional view 1500 of FIG. 15, a third etch is performed into the bottom electrode layer 110l (see, e.g., FIG. 14) and the bottom electrode barrier layer 502l (see, e.g., FIG. 14) with the sidewall spacers 108 and the hard masks 1204 in place. The third etch stops on the second via dielectric layer 506 and removes the hard masks 1204. In alternative embodiments, the hard masks 1204 persist upon completion of the third etch. Further, the third etch transfers patterns of the hard masks 1204 and the sidewall spacers 108 to the bottom electrode layer 110l and the bottom electrode barrier layer 502l, thereby dividing the bottom electrode layer 110l and the bottom electrode barrier layer 502l into segments.

The segments of the bottom electrode layer 110l are individual to and respectively at the 1T1R cells 702 and are hereafter referred to as bottom electrodes 110. Similarly, the segments of the bottom electrode barrier layer 502l are individual to and respectively at the 1T1R cells 702 and are hereafter referred to as bottom electrode barriers 502. The bottom and top electrodes 110, 114 and the data storage elements 112 collectively form memory cells 102 respectively at the 1T1R cells 702. Because the data storage elements 112 are MTJ elements, the memory cells 102 are MRAM cells. However, the memory cells 102 may be FeRAM cells, RRAM cells, or some other suitable type of memory cell in alternative embodiments.

While the second and third etches are described as separate etches, the second and third etches may be one and the same in alternative embodiments. For example, etching of the second and third etches may be performed uninterrupted from a beginning of the etching of the second etch to an end of the etching of the third etch within a single process chamber.

Figure 16A:
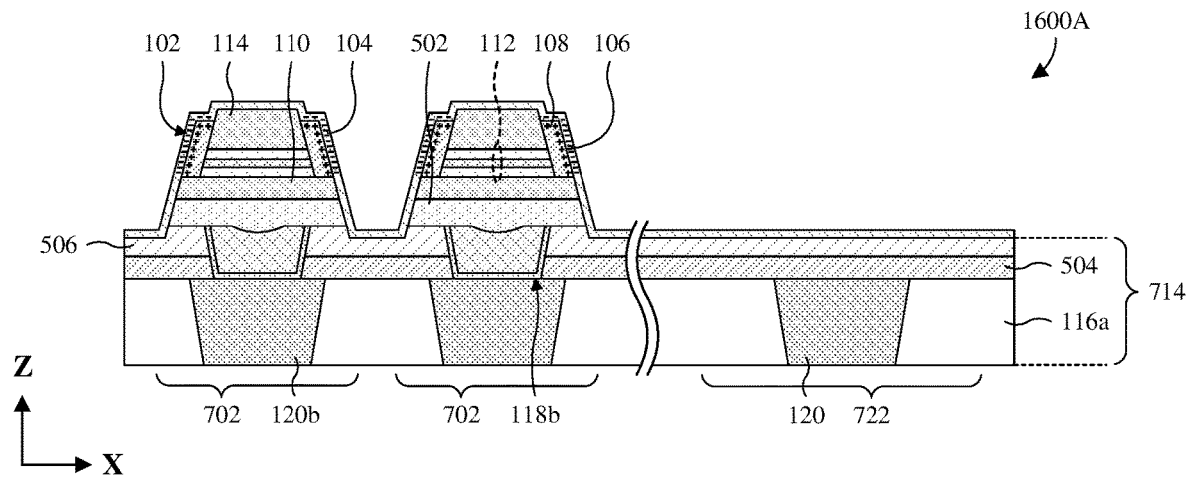
Figure 16B:
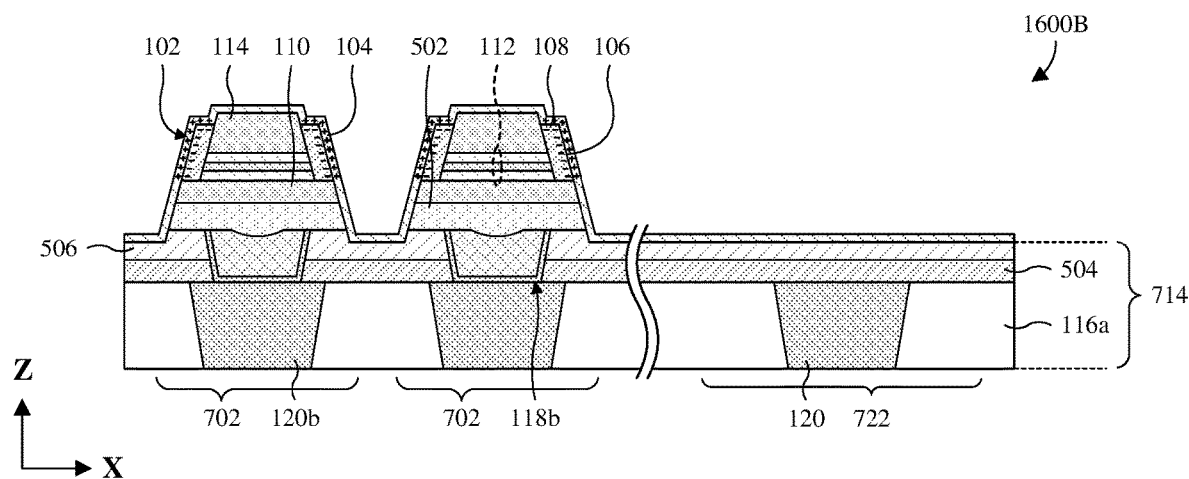

As illustrated by the cross-sectional views 1600A, 1600B of FIGS. 16A and 16B, an etch stop layer 104 is deposited. FIGS. 16A and 16B corresponds to alternative embodiments of the deposition in which the resulting electric dipole has different polarities. The etch stop layer 104 is deposited covering the memory cells 102 and the second via dielectric layer 506 and further lining common sidewalls formed by the sidewall spacers 108, the bottom electrodes 110, and the bottom electrode barriers 502. Further, the etch stop layer 104 is undoped and may, for example, be deposited by ALD and/or some other suitable deposition process(es).

In some embodiments, the etch stop layer 104 is or comprise a metal oxide and/or is a high k dielectric with a dielectric constant greater than about 3.9. In some embodiments, the etch stop layer 104 is or comprises aluminum oxide, tantalum oxide, titanium oxide, ruthenium oxide, silver oxide, tungsten oxide, vanadium oxide, tin oxide, zirconium oxide, hafnium oxide, lanthanum oxide, magnesium oxide, calcium oxide, some other suitable material(s), or any combination of the foregoing. In some embodiments, an atomic percentage of metal in the etch stop layer 104 is less than about 40% or some other suitable value.

Upon deposition of the etch stop layer 104, an electric dipole (schematically illustrated by pluses and minuses) forms at an interface 106 between the etch stop layer 104 and the sidewall spacer layer 108l. In FIG. 16A, the electric dipole has negative charge accumulating at the interface 106 in the etch stop layer 104 and positive charge accumulating at the interface 106 in the sidewall spacer layer 108l. The electric dipole may, for example, form due to the etch stop layer 104 having a greater oxygen areal density than the sidewall spacer layer 108l and/or a lesser electronegativity than the sidewall spacer layer 108l. In FIG. 16B, the electric dipole has the negative charge accumulating at the interface 106 in the sidewall spacer layer 108l and the positive charge accumulating at the interface 106 in the etch stop layer 104. Such embodiments may, for example, arise when the etch stop layer 104 has a lesser oxygen areal density than the sidewall spacer layer 108l and/or a greater electronegativity than the sidewall spacer layer 108l.

Figure 17:
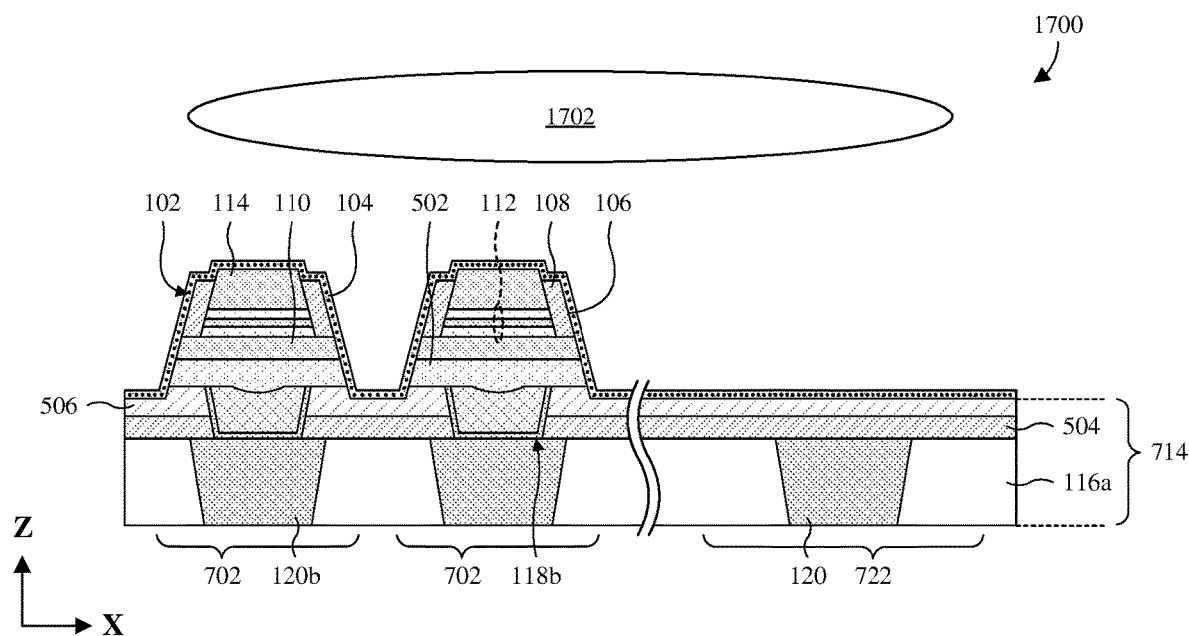

As illustrated by the cross-sectional view 1700 of FIG. 17, a plasma treatment process is performed on the etch stop layer 104 to dope (schematically illustrated by black dots) the etch stop layer 104 to reduce charge accumulation at the interface 106. The plasma treatment process proceeds from either FIG. 16A or 16B since FIGS. 16A and 16B are alternatives.

To the extent that negative charge accumulates in the etch stop layer 104 (see, e.g., FIG. 16A), the etch stop layer 104 may be doped with acceptor dopants. The acceptor dopants result in holes that negate the accumulated negative charge in the etch stop layer 104 and may, for example, be or comprise nitrogen, hydrogen, bromide, lithium, carbon, phosphorous, gallium, aluminum, ammonia, some other suitable element(s), or any combination of the foregoing. To the extent that positive charge accumulates in the etch stop layer 104 (see, e.g., FIG. 16B), the etch stop layer 104 may be doped with donor dopants. The donor dopants result in electrons that negate the accumulated positive charge in the etch stop layer 104.

The plasma treatment may, for example, comprise generating plasma 1702 containing the dopants and exposing the etch stop layer 104 to the plasma 1702. Other suitable processes are, however, amenable. In some embodiments in which the etch stop layer 104 is or comprises aluminum oxide, the plasma treatment comprises generating plasma from ammonia or some other suitable acceptor dopant and subsequently exposing the etch stop layer 104 to the plasma for about 30 seconds or some other suitable amount of time.

In some embodiments, upon completion of the doping, the etch stop layer 104 is or comprises nitrogen-doped aluminum oxide, hydrogen-doped aluminum oxide, boron-doped aluminum oxide, carbon-doped aluminum oxide, lithium-doped aluminum oxide, phosphorous-doped aluminum oxide, nitrogen-doped tantalum oxide, nitrogen-doped titanium oxide, aluminum-doped tantalum oxide, aluminum-doped tantalum titanium oxide, nitrogen-doped aluminum, nitrogen-doped titanium, nitrogen-doped ruthenium oxide, hydrogen-doped silver oxide, nitrogen-doped tungsten oxide, nitrogen-doped vanadium oxide, hydrogen-doped strontium, hydrogen-doped zirconium oxide, nitrogen-doped hafnium oxide, nitrogen-doped lanthanum oxide, hydrogen-doped magnesium oxide, hydrogen-doped calcium oxide, some other suitable doped material(s), or any combination of the foregoing. In some embodiments, to the extent that the etch stop layer 104 is doped with metal, an atomic percentage of metal in the etch stop layer 104 is more than about 40% or some other suitable value upon completion.

By reducing charge accumulation at the interface 106, an electric field produced by the electric dipole is reduced. As such, the electric field minimally affects electrical properties of the data storage elements 112. Absent the reduction, the electric field may materially degrade electrical properties of the data storage elements 112. For example, the electric field may degrade (e.g., decrease) the coercive voltage of the data storage elements 112. This may, in turn, lead to failure of the memory cells 102 and/or decrease manufacturing yields.

While the etch stop layer 104 is described as being deposited as undoped and then doped via plasma treatment, the etch stop layer 104 may alternatively be deposited doped. In other words, the etch stop layer 104 may be doped simultaneously while being deposited with dopants configured to mitigate the electric dipole as described above. Such deposition may, for example, be performed by CVD and/or some other suitable deposition process(es). By depositing the etch stop layer 104 doped, the plasma treatment of FIG. 17 may be omitted.

In some embodiments in which the etch stop layer 104 is or comprises aluminum oxide, deposition of the etch stop layer 104 by CVD may comprise exposing the etch stop layer 104 to a process gas comprising: 1) an aluminum source (e.g., trimethylaluminum (TMA) or some other suitable aluminum source); 2) water vapor (e.g., $H_2O$); and 3) and ammonia (e.g., $NH_3$) or some other suitable dopant source. Other suitable processes are, however, amenable.

Figure 18:
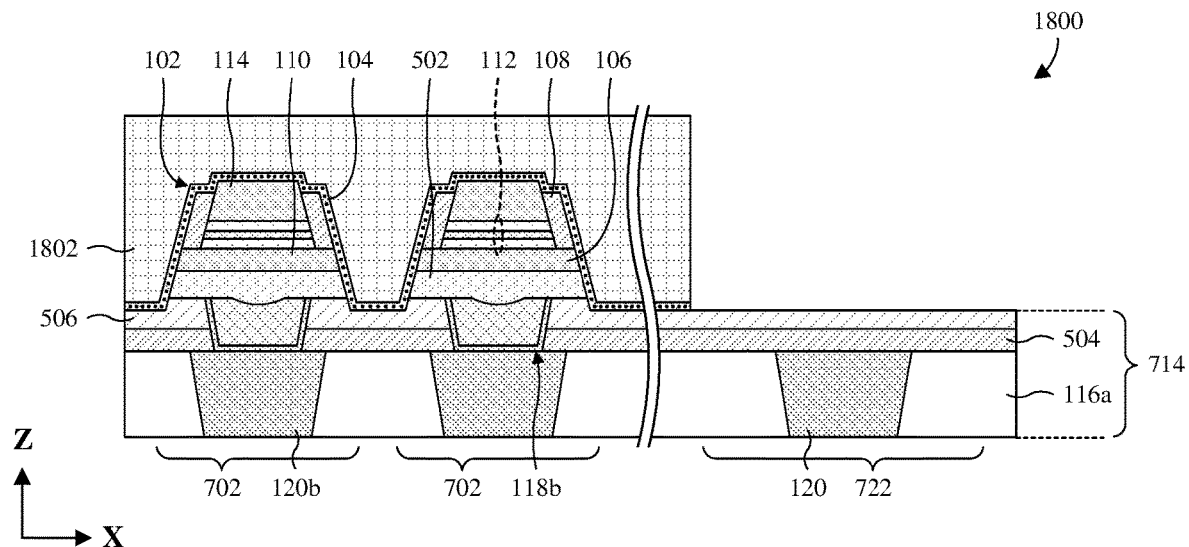

As illustrated by the cross-sectional view 1800 of FIG. 18, the etch stop layer 104 is patterned to clear the etch stop layer 104 from the peripheral region 722 of the IC chip being formed. A process for performing the patterning may, for example, comprises: 1) forming a mask 1802 covering the memory cells 102 by photolithography; 2) performing an etch into the etch stop layer 104 with the mask 1802 in place; and 3) removing the mask 1802. Other suitable processes are, however, amenable.

Figure 19:
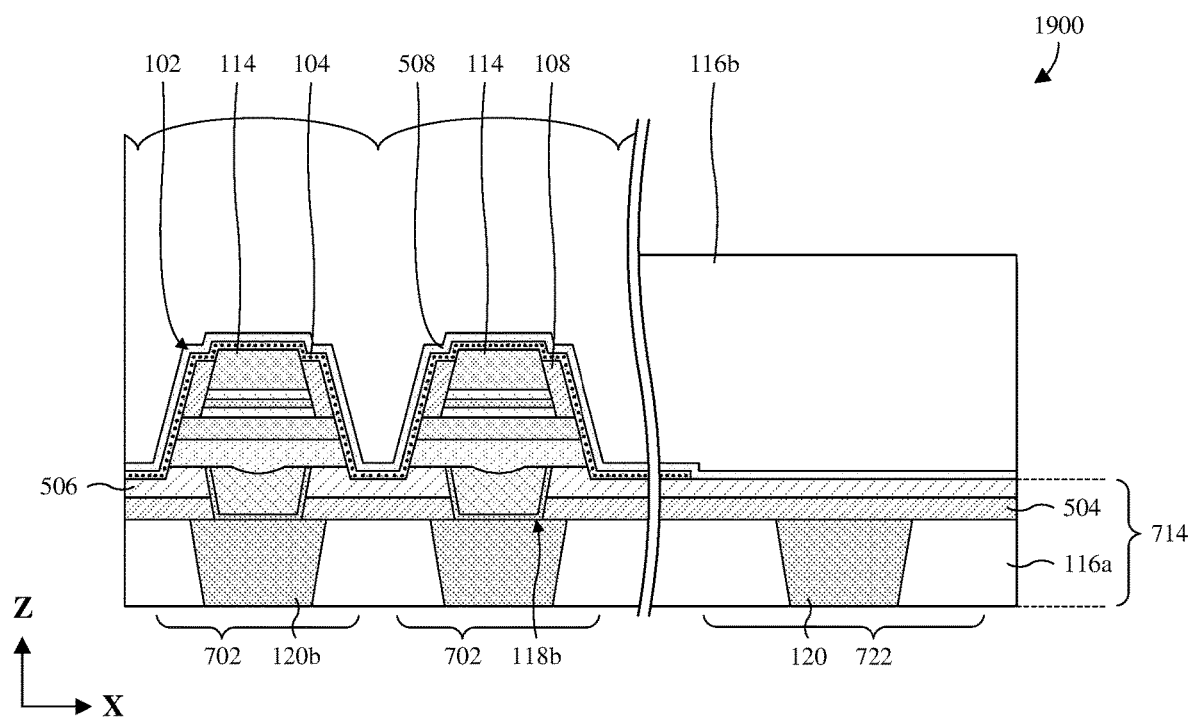

As illustrated by the cross-sectional view 1900 of FIG. 19, a buffer layer 508 is deposited covering and lining the etch stop layer 104 and the second via dielectric layer 506. Further, a second IMD layer 116b is deposited covering the buffer layer 508. In alternative embodiments, the buffer layer 508 is omitted. The buffer layer 508 may, for example, be configured to enhance adhesion from the second IMD layer 116b to the etch stop layer 104 and/or the second via dielectric layer 506. Further, the buffer layer 508 may, for example, be or comprise a dielectric oxide and/or some other suitable dielectric(s).

Figure 20:
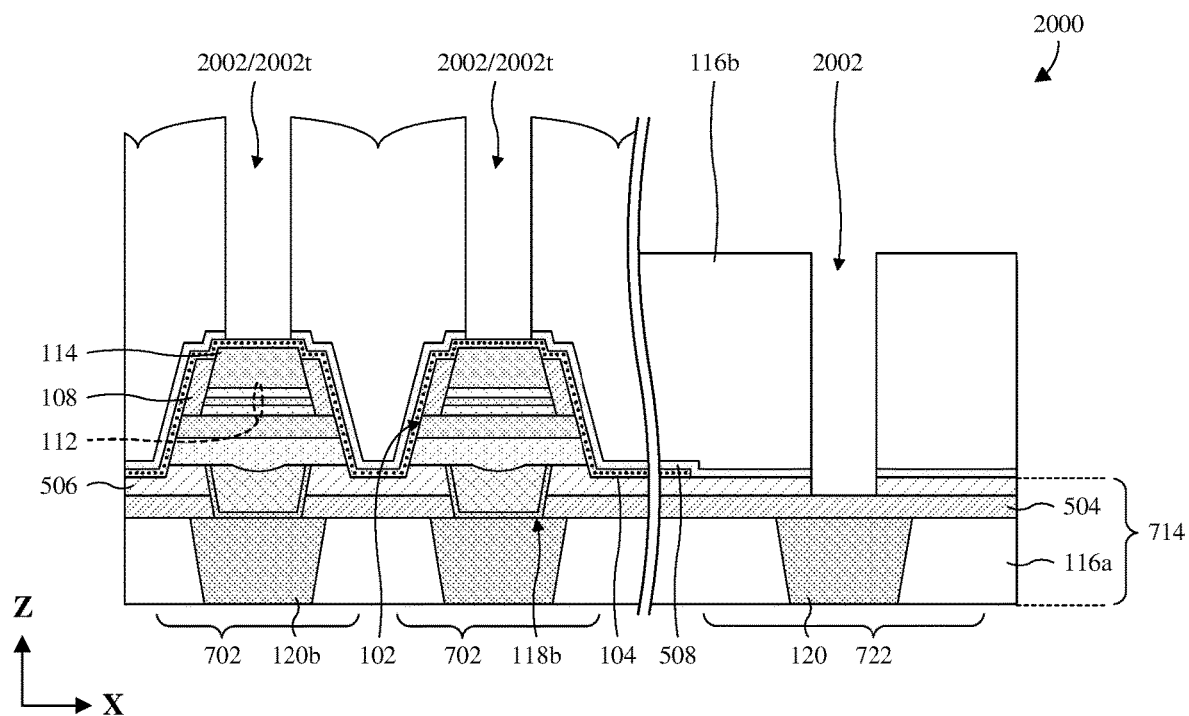

As illustrated by the cross-sectional view 2000 of FIG. 20, the second IMD layer 116b is patterned to form a plurality of via opening 2002 extending through the second IMD layer 116b and the buffer layer 508. The plurality of via openings 2002 include top electrode via openings 2002t individual to and respectively overlying the memory cells 102. A process for performing the patterning may, for example, comprise: 1) forming a mask over the second IMD layer 116b by photolithography; 2) performing an etch into the second IMD layer 116b and the buffer layer 508 with the mask in place; 3) stopping the etch on the etch stop layer 104 and the first via dielectric layer 504; and 4) removing the mask. Other suitable processes are, however, amenable.

In some embodiments, an etchant used by the etch has a low etch rate for the etch stop layer 104 relative to the second IMD layer 116b and the buffer layer 508. In other words, the etchant has a high selectivity for the second IMD layer 116b and the buffer layer 508 relative to the etch stop layer 104. A low etch rate may, for example, be an etch rate that is less than about $1/20^{th}$, $1/50^{th}$, $1/100^{th}$, or some other suitable fraction of an etch rate of the second IMD layer 116b. In some embodiments, the low etch rate is, or is less than, about 26.6 A/min, about 10 A/min, or some other suitable value. In some embodiments, the etchant also has a low etch rate for the etch stop layer 104 relative to the sidewall spacer 108. In some embodiments, the etchant also has a low etch rate for the first via dielectric layer 504 relative to the second IMD layer 116b, the buffer layer 508, and the second via dielectric layer 506.

At least when the memory cells 102 are small, the etchant used by the etch may erode the sidewall spacers 108 and damage the data storage elements 112 from the side absent the etch stop layer 104. However, because the etchant may have the low etch rate for the etch stop layer 104 relative to the second IMD layer 116b, the etch stop layer 104 may prevent the sidewall spacer 108 and the data storage elements 112 from erosion and damage.

Figure 21:
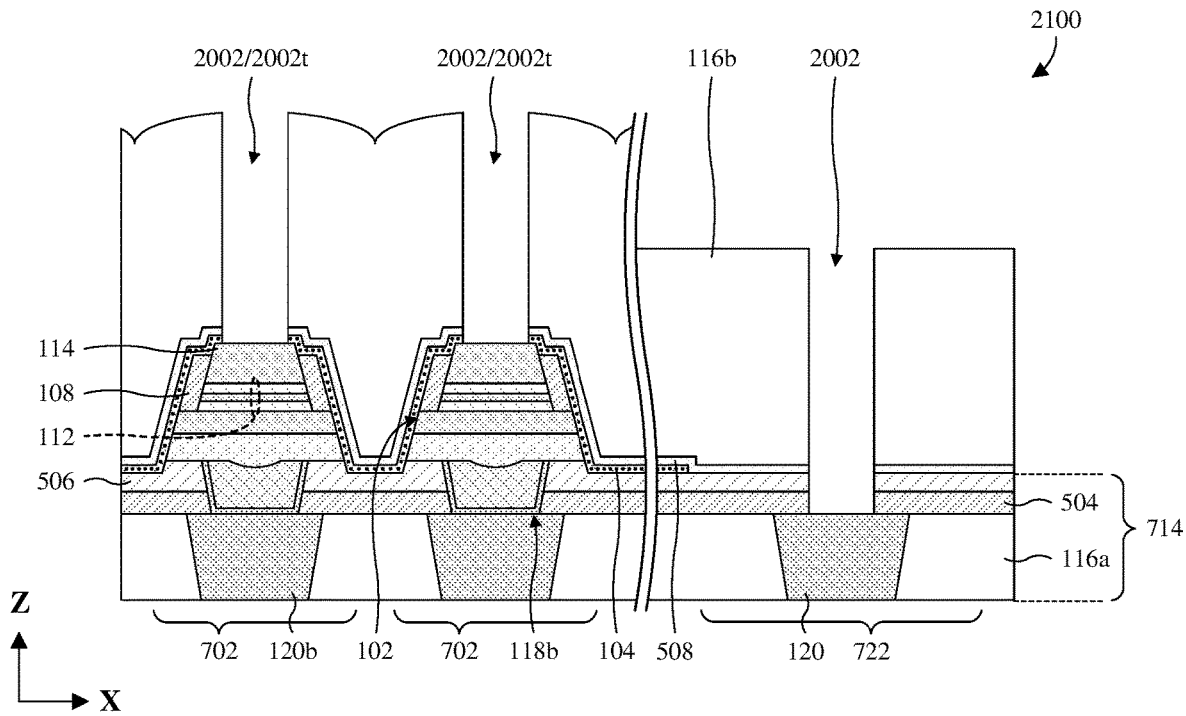

As illustrated by the cross-sectional view 2100 of FIG. 21, a fourth etch is performed into the etch stop layer 104 and the first via dielectric layer 504 through the via openings 2002. The fourth etch exposes individual top surfaces of the top electrodes 114 and further exposes a top surface of a wire at the peripheral region 722.

Figure 22:
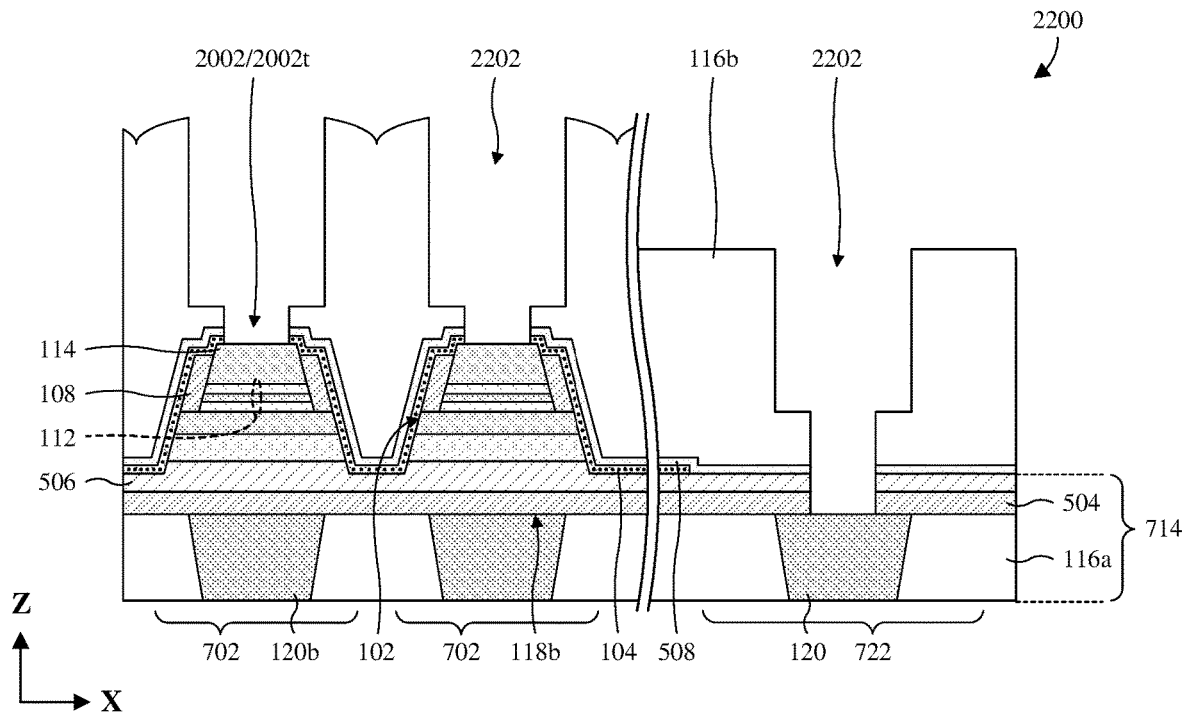

As illustrated by the cross-sectional view 2200 of FIG. 22, the second IMD layer 116*b* is patterned to form a plurality of wire opening 2202 overlapping with the via openings 2002. A process for performing the patterning may, for example, comprise: 1) forming a mask over the second IMD layer 116*b* by photolithography; 2) performing an etch into the second IMD layer 116*b* with the mask in place; and 3) removing the mask. Other suitable processes are, however, amenable. In some embodiments, mask material fills the via openings 2002 while performing the etch to protect the top electrodes 114 from damage.

Figure 23:
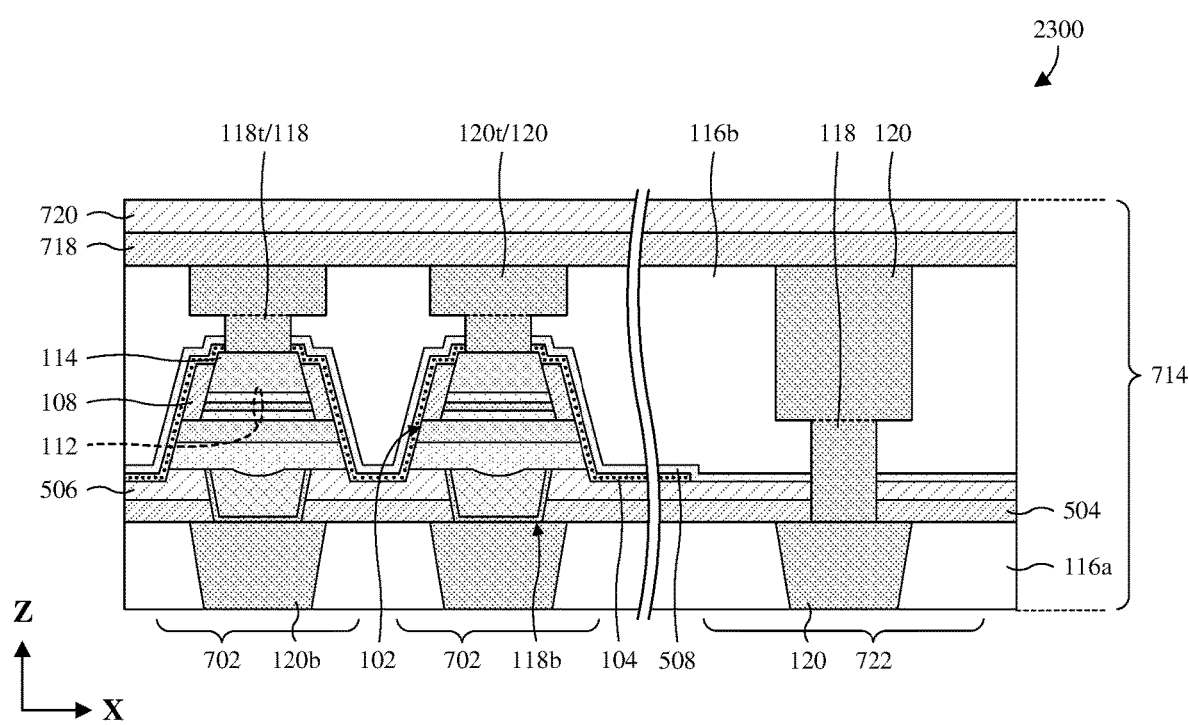

As illustrated by the cross-sectional view 2300 of FIG. 23, a plurality of additional wires 120 and a plurality of additional vias 118 are formed filling the via openings 2002 (see, e.g., FIG. 22) and the wire openings 2202 (see, e.g., FIG. 22). The plurality of additional wires 120 respectively fill the wire openings 2202 and comprise a plurality of top electrode wires 120*t* individual to and respectively overlying the memory cells 102. The plurality of additional vias 118 respectively fill the via openings 2002 and comprise a plurality of top electrode vias 118*t* individual to and respectively at the top electrodes 114. Further, the top electrode vias 118*t* extend respectively from the top electrode wires 120*t* respectively to the top electrodes 114.

A process for forming the additional wires 120 and the additional vias 118 may, for example, comprise: 1) depositing a metal layer filling the via openings 2002 and the wire openings 2202; and 2) performing a planarization into the metal layer and the second IMD layer 116*b* until top surfaces of the second IMD layer 116*b* and the metal layer are level with each other. Other suitable processes are, however, amenable.

Also illustrated by the cross-sectional view 2300 of FIG. 23, a first passivation layer 718 and a second passivation layer 720 are deposited over the second IMD layer 116*b* and the additional wires 120. In alternative embodiments, the first passivation layer 718 or the second passivation layer 720 is omitted. The first passivation layer 718 may, for example, be or comprise silicon carbide and/or some other suitable dielectric(s), and/or the second passivation layer 720 may, for example, be or comprise silicon oxide and/or some other suitable dielectric(s).

While FIGS. 10-15, 16A, 16B, and 17-23 are described with reference to a method, it will be appreciated that the structures shown in FIGS. 10-15, 16A, 16B, and 17-23 are not limited to the method but rather may stand alone separate of the method. While FIGS. 10-15, 16A, 16B, and 17-23 are described as a series of acts, it will be appreciated that the order of the acts may be altered in other embodiments. While FIGS. 10-15, 16A, 16B, and 17-23 illustrate and describe as a specific set of acts, some acts that are illustrated and/or described may be omitted in other embodiments. Further, acts that are not illustrated and/or described may be included in other embodiments.

Figure 24:
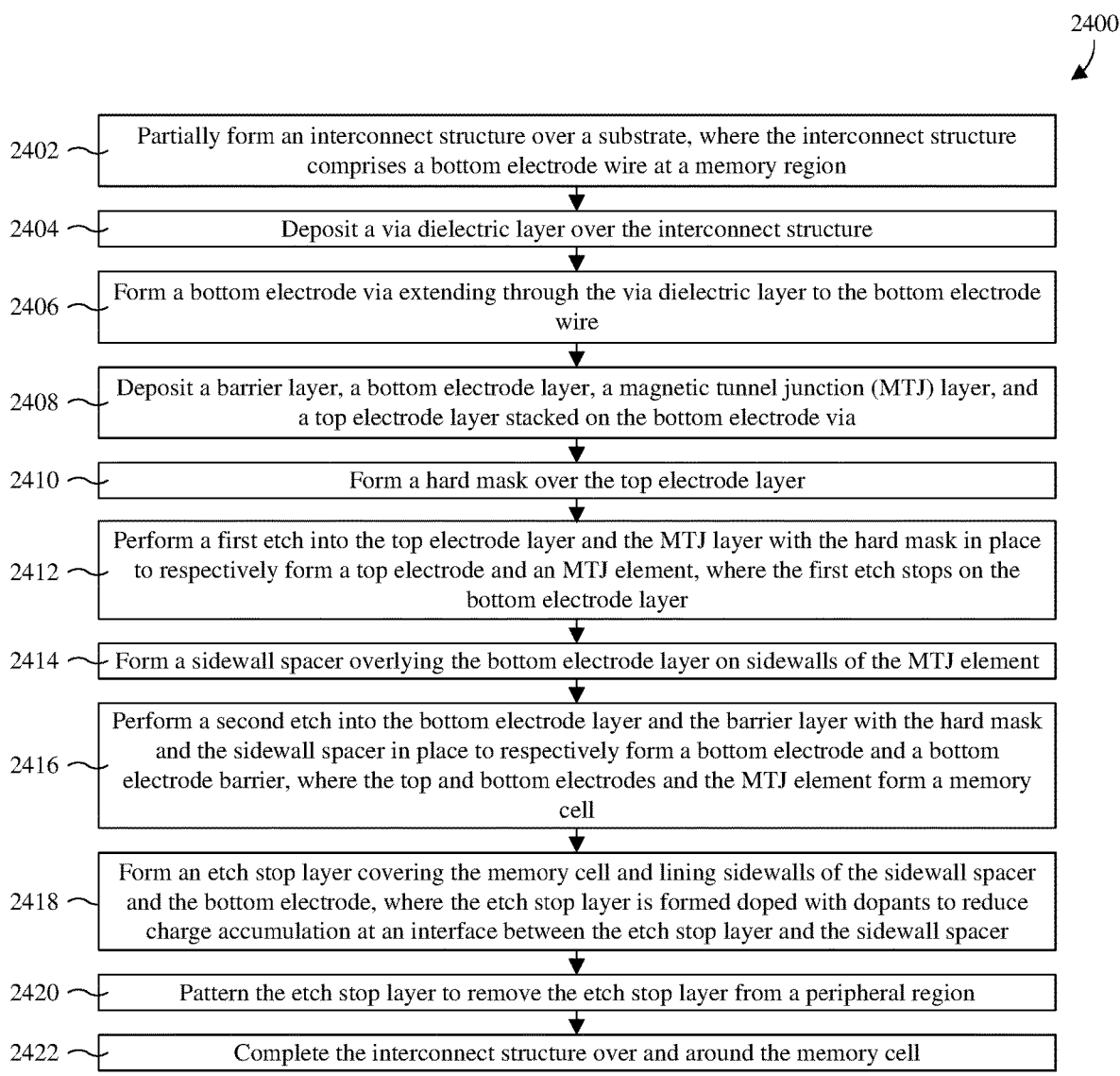
FIG. 24 illustrates a block diagram of some embodiments of the method of FIGS. 10-15, 16A, 16B, and 17-23.

With reference to FIG. 24, a block diagram 2400 of some embodiments of the method of FIGS. 10-15, 16A, 16B, and 17-23 is provided.

At 2402, an interconnect structure is partially formed over a substrate, where the interconnect structure comprises a bottom electrode wire at a memory region. See, for example, FIG. 10.

At 2404, a via dielectric layer is deposited over the interconnect structure. See, for example, FIG. 11.

At 2406, a bottom electrode via is formed extending through the via dielectric layer to the bottom electrode wire. See, for example, FIG. 11.

At 2408, a barrier layer, a bottom electrode layer, a MTJ layer, and a top electrode layer are deposited stacked on the bottom electrode via. See, for example, FIG. 12.

At 2410, a hard mask is formed over the top electrode layer. See, for example, FIG. 12.

At 2412, a first etch is performed into the top electrode layer and the MTJ layer with the hard mask in place to respectively form a top electrode and an MTJ element, where the first etch stops on the bottom electrode layer. See, for example, FIG. 13.

At 2414, a sidewall spacer is formed overlying the bottom electrode layer on sidewalls of the MTJ element. See, for example, FIGS. 14 and 15.

At 2416, a second etch is performed into the bottom electrode layer and the barrier layer with the hard mask and the sidewall spacer in place to respectively form a bottom electrode and a bottom electrode barrier, where the top and bottom electrodes and the MTJ element form a memory cell. See, for example, FIG. 15.

At 2418, an etch stop layer is formed covering the memory cell and lining sidewalls of the sidewall spacer and the bottom electrode, where the etch stop layer is formed doped with dopants to reduce charge accumulation at an interface between the etch stop layer and the sidewall spacer. See, for example, FIGS. 16A, 16B, and 17.

At 2420, the etch stop layer is patterned to remove the etch stop layer from a peripheral region. See, for example, FIG. 18.

At 2422, the interconnect structure is completed over and around the memory cell. See, for example, FIGS. 19-23.

While the block diagram 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 25:
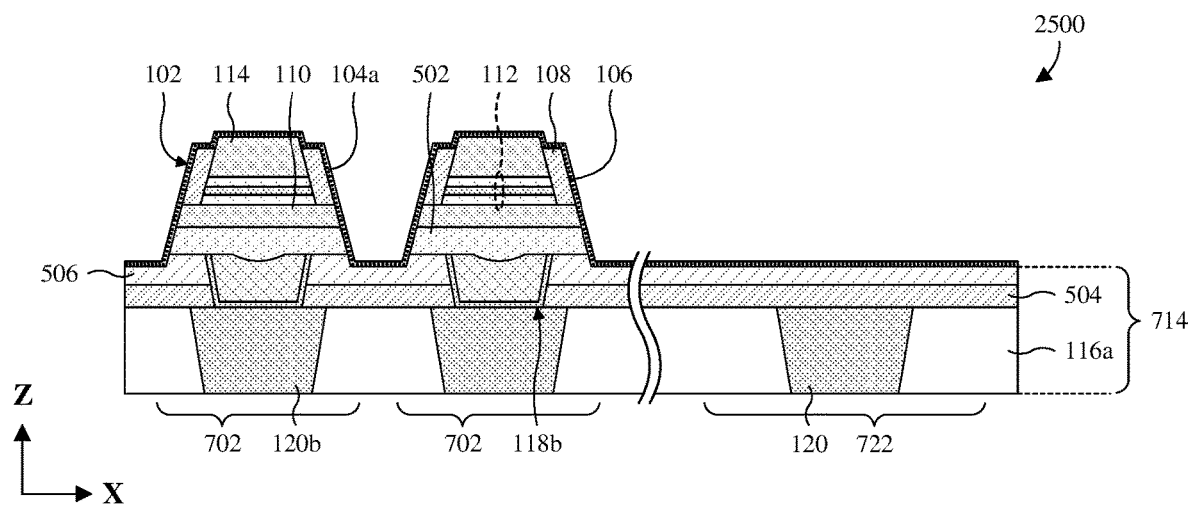
FIGS. 25-27 illustrate a series of cross-sectional views of some first alternative embodiments of the method of FIGS. 10-15, 16A, 16B, and 17-23.
Figure 26:
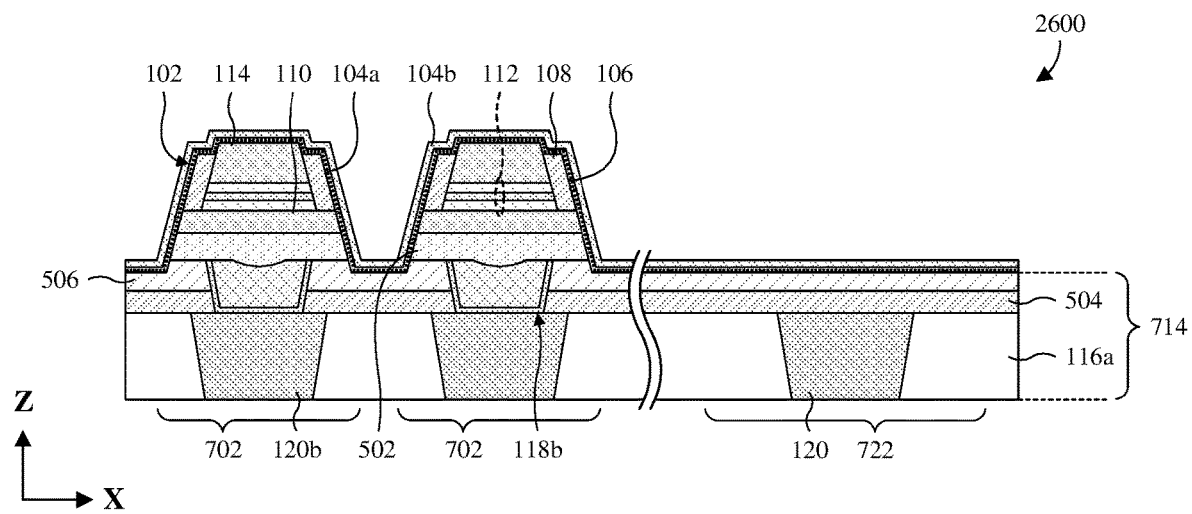
Figure 27:
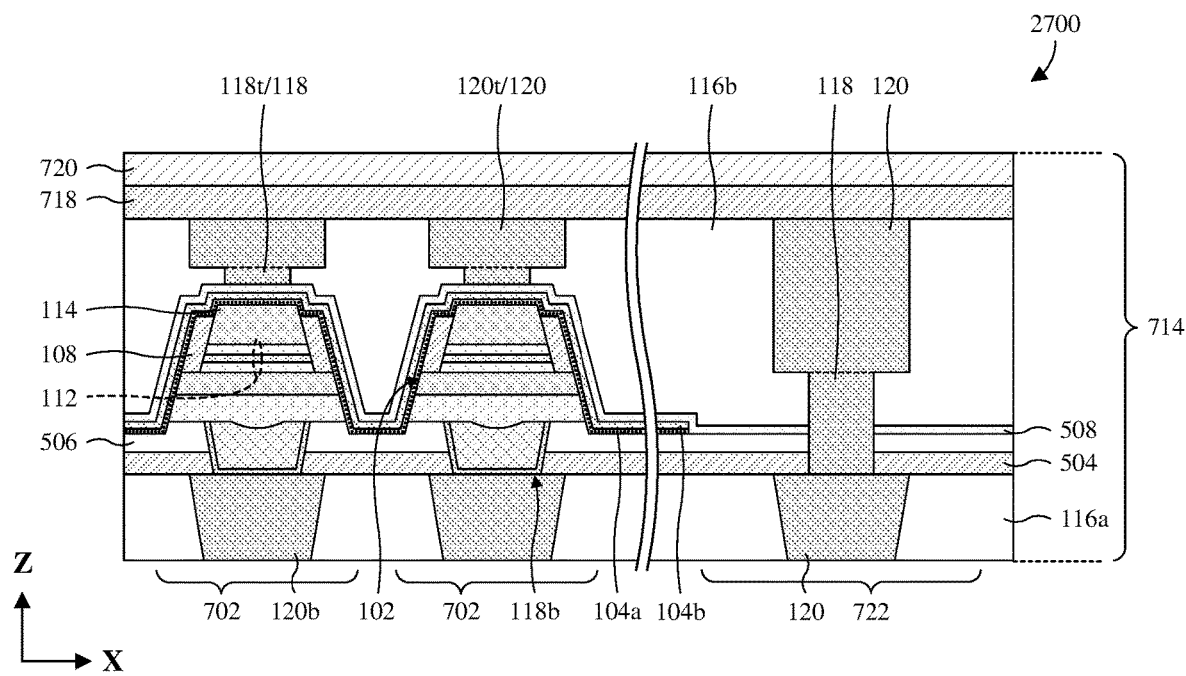

With reference to FIGS. 25-27, a series of cross-sectional views 2500-2700 of some first alternative embodiments of the method of FIGS. 10-15, 16A, 16B, and 17-23 is provided in which the etch stop layer 104 is split into a doped etch stop layer 104*a* and an undoped etch stop layer 104*b*. The first alternative embodiments may, for example, be performed to form the IC chip with embodiments of the etch stop layer 104 in FIG. 4A.

As illustrated by the cross-sectional view 2500 of FIG. 25, the acts described with regard to FIGS. 10-15 are performed. Further, a doped etch stop layer 104*a* is formed covering the memory cells 102 and the second via dielectric layer 506 and further lining common sidewalls formed by the sidewall spacers 108, the bottom electrodes 110, and the bottom electrode barriers 502. The doped etch stop layer 104*a* is doped to reduce charge accumulation at an interface 106 between the doped etch stop layer 104*a* and the sidewall spacer 108. The doped etch stop layer 104a is doped as described for the etch stop layer 104 with regard to FIG. 17. In some embodiments, the doped etch stop layer 104a is formed as described with regard to FIGS. 16 and 17. For example, the doped etch stop layer 104a may be deposited undoped as described with regard to FIGS. 16A-16B and then may be doped by plasma treatment as described with regard to FIG. 17. In other embodiments, the doped etch stop layer 104a may be deposited doped.

As illustrated by the cross-sectional view 2600 of FIG. 26, an undoped etch stop layer 104b is deposited covering and lining the doped etch stop layer 104a. The deposition may, for example, be performed by ALD or some other suitable deposition process.

The undoped etch stop layer 104b may, for example, be as the etch stop layer 104 is described with regard to FIGS. 16A-16B. In some embodiments, an atomic percentage of metal in the undoped etch stop layer 104b is less than about 40% or some other suitable value, whereas an atomic percentage of metal in the doped etch stop layer 104a is greater than about 40% or some other suitable value. In some embodiments, a doping concentration of the doped etch stop layer 104a is three or more times a concentration of any impurities in the undoped etch stop layer 104b. In some embodiments, the undoped etch stop layer 104b is a same material as the doped etch stop layer 104a except for the dopants of the doped etch stop layer 104a.

As illustrated by the cross-sectional view 2700 of FIG. 27, the acts described with regard to FIGS. 18-23 are performed to complete the interconnect structure 714 over and around the memory cells. Further, while performing the patterning described with regard to FIG. 20, an etchant used by the patterning may have a lower etch rate for the undoped etch stop layer 104b than for the doped etch stop layer 104a, whereby the undoped etch stop layer 104b may provide enhanced protection to the memory cells 102.

While FIGS. 25-27 are described with reference to a method, it will be appreciated that the structures shown in FIGS. 25-27 are not limited to the method but rather may stand alone separate of the method. While FIGS. 25-27 are described as a series of acts, it will be appreciated that the order of the acts may be altered in other embodiments. While FIGS. 25-27 illustrate and describe as a specific set of acts, some acts that are illustrated and/or described may be omitted in other embodiments. Further, acts that are not illustrated and/or described may be included in other embodiments.

Figure 28:
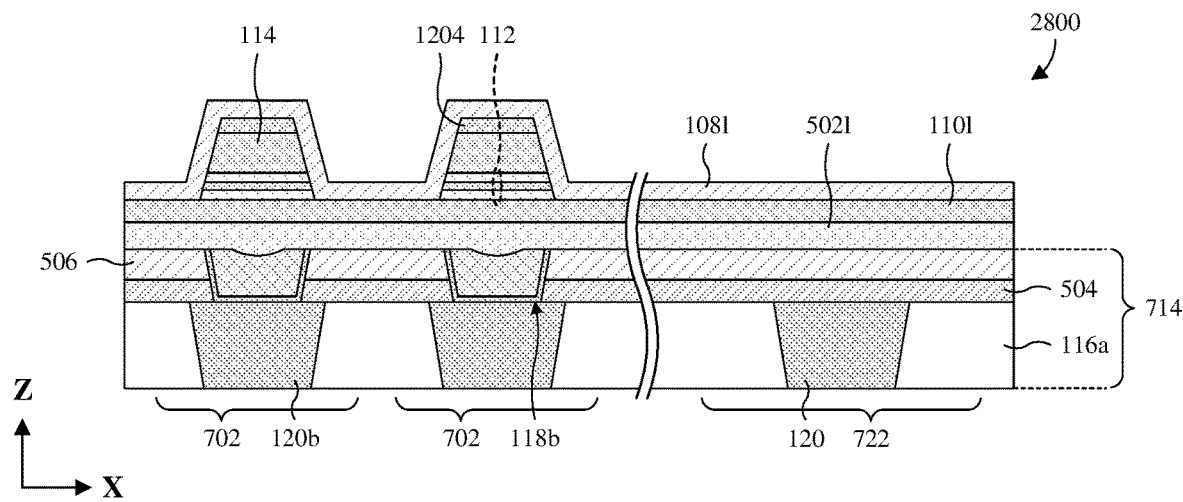
FIGS. 28-30 illustrate a series of cross-sectional views of some second alternative embodiments of the method of FIGS. 10-15, 16A, 16B, and 17-23.
Figure 29:
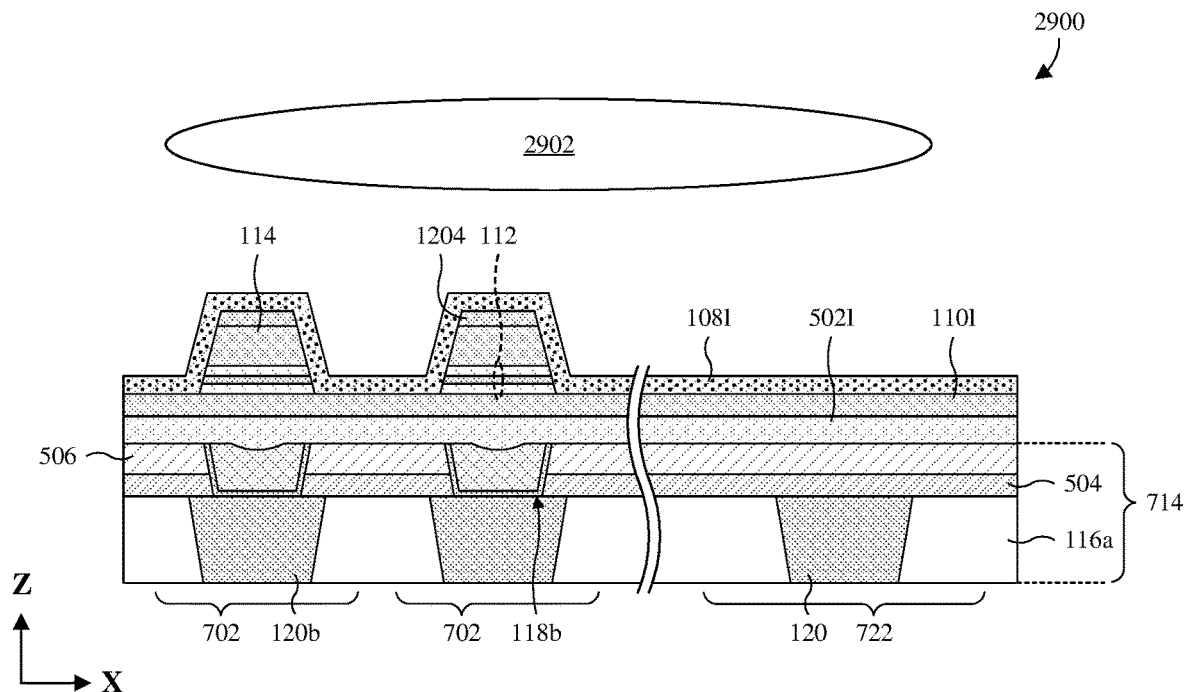
Figure 30:
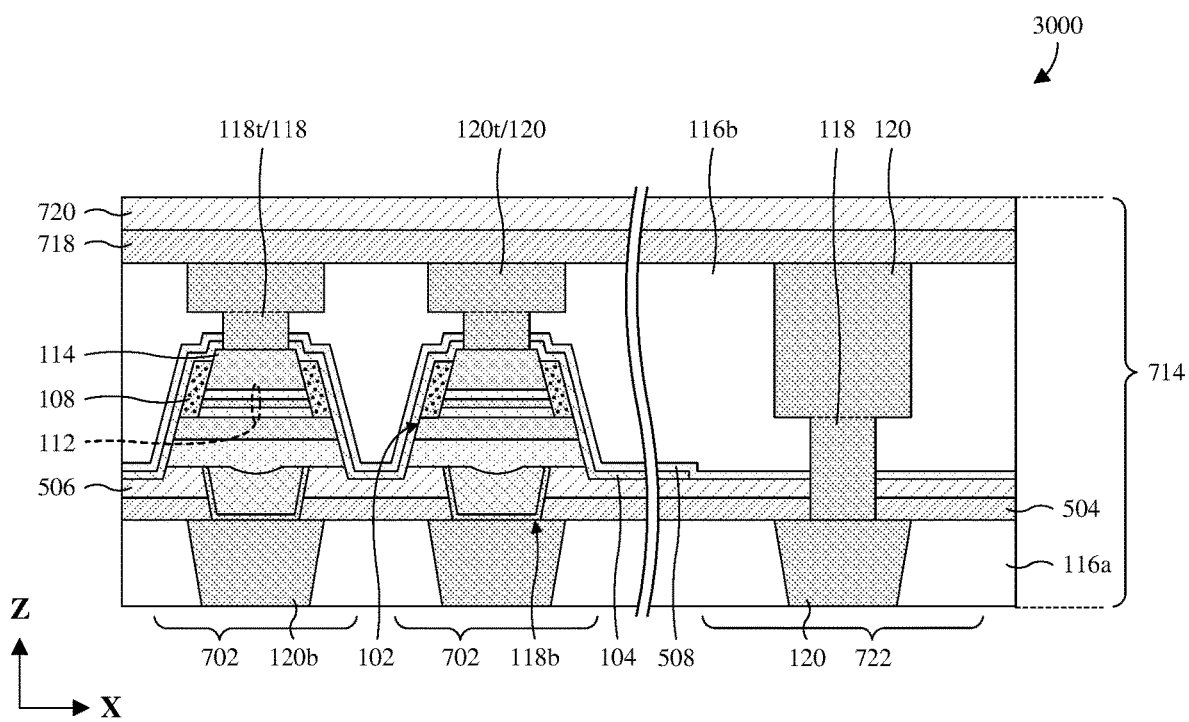

With reference to FIGS. 28-30, a series of cross-sectional views 2800-3000 of some second alternative embodiments of the method of FIGS. 10-15, 16A, 16B, and 17-23 is provided in which sidewall spacers 108 are doped to reduce charge accumulation at the interface 106 with the etch stop layer 104. The second alternative embodiments may, for example, be performed to form the IC chip with embodiments of the sidewall spacer 108 in FIG. 4B.

As illustrated by the cross-sectional view 2800 of FIG. 28, the acts described with regard to FIGS. 10-13 are performed. Further, a sidewall spacer layer 108l is deposited undoped. The sidewall spacer layer 108l may, for example, be as described with regard to FIG. 14 and/or may, for example, be deposited by ALD and/or some other suitable deposition process(es).

As illustrated by the cross-sectional view 2900 of FIG. 29, a plasma treatment process is performed on the sidewall spacer layer 108l to dope (schematically illustrated by black dots) the sidewall spacer layer 108l. As seen hereafter, the doping may reduce charge accumulating at an interface between the sidewall spacer layer 108l and a etch stop layer subsequently formed.

To the extent that positive charge accumulates in the sidewall spacer layer 108l at the interface, the sidewall spacer layer 108l may be doped with donor dopants. The donor dopants may be or comprise, for example, fluorine, chlorine, bromine, sulfur, some other suitable donor dopants, or any combination of the foregoing. To the extent that negative charge accumulates in the sidewall spacer layer 108l at the interface, the sidewall spacer layer 108l may be doped with acceptor dopants. The plasma treatment may, for example, comprise generating plasma 2902 containing the dopants and exposing the sidewall spacer layer 108l to the plasma 2902. Other suitable processes are, however, amenable.

In some embodiments, upon completion of the doping, the sidewall spacer layer 108l is or comprises nitrogen-doped silicon oxide, sulfur-doped silicon nitride, carbon-doped silicon nitride, carbon-doped silicon phosphide, fluorine-doped silicon oxide, chlorine-doped silicon oxide, some other suitable doped material(s), or any combination of the foregoing.

While the sidewall spacer layer 108l is described as being deposited as undoped and then doped via plasma treatment, the sidewall spacer layer 108l may alternatively be deposited doped. In other words, the sidewall spacer layer 108l may be doped simultaneously while being deposited with dopants configured to mitigate charge accumulation as above. Such deposition may, for example, be performed by CVD and/or some other suitable deposition process(es). By depositing the sidewall spacer layer 108l doped, the plasma treatment of FIG. 29 may be omitted.

As illustrated by the cross-sectional view 3000 of FIG. 30, the acts described with regard to FIGS. 15, 16A, 16B, and 17-23 are performed as described above, except that the plasma treatment at FIG. 17 may or may not be performed. As such, the etch stop layer 104 may be doped or undoped. Because the sidewall spacers 108 are doped, the electric dipoles at FIGS. 16A and 16B do not, or minimally, form. For example, the doping may shift the electronegativity of the sidewall spacers 108 closer to that of the etch stop layer 104 to minimize the electric dipoles.

While FIGS. 28-30 are described with reference to a method, it will be appreciated that the structures shown in FIGS. 28-30 are not limited to the method but rather may stand alone separate of the method. While FIGS. 28-30 are described as a series of acts, it will be appreciated that the order of the acts may be altered in other embodiments. While FIGS. 28-30 illustrate and describe as a specific set of acts, some acts that are illustrated and/or described may be omitted in other embodiments. Further, acts that are not illustrated and/or described may be included in other embodiments.

Figure 31:
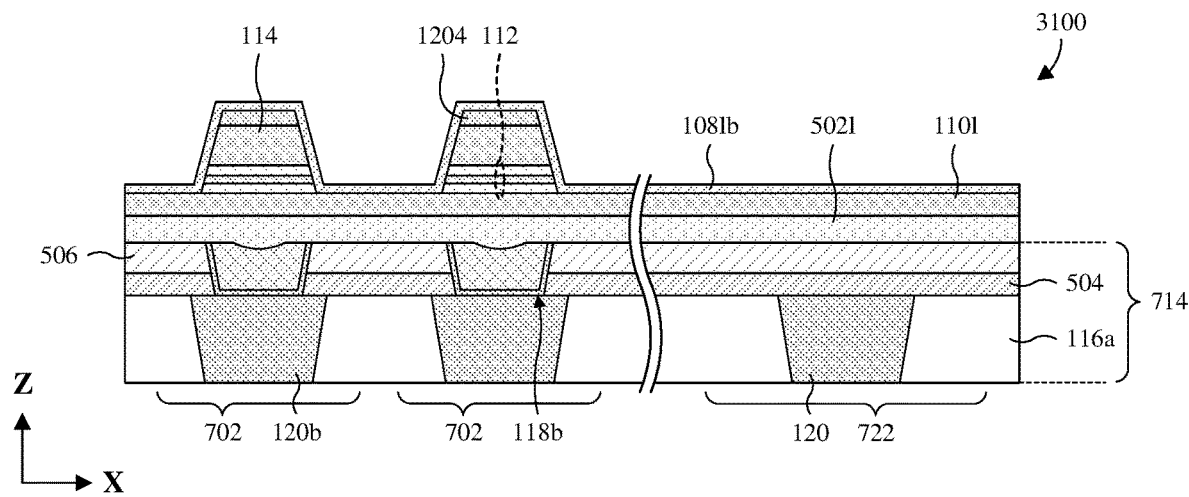
FIGS. 31-33 illustrate a series of cross-sectional views of some third alternative embodiments of the method of FIGS. 10-15, 16A, 16B, and 17-23.
Figure 32:
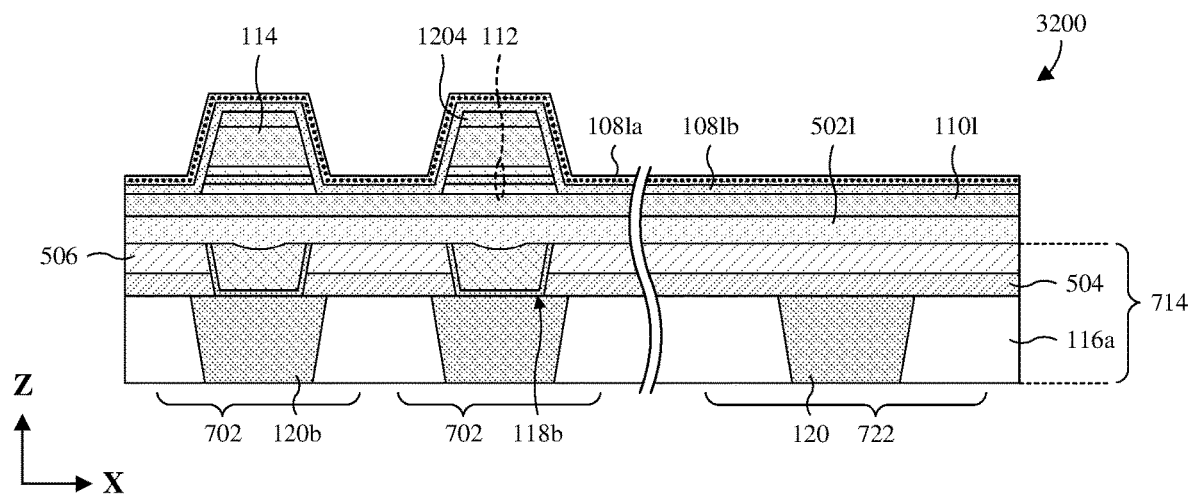
Figure 33:
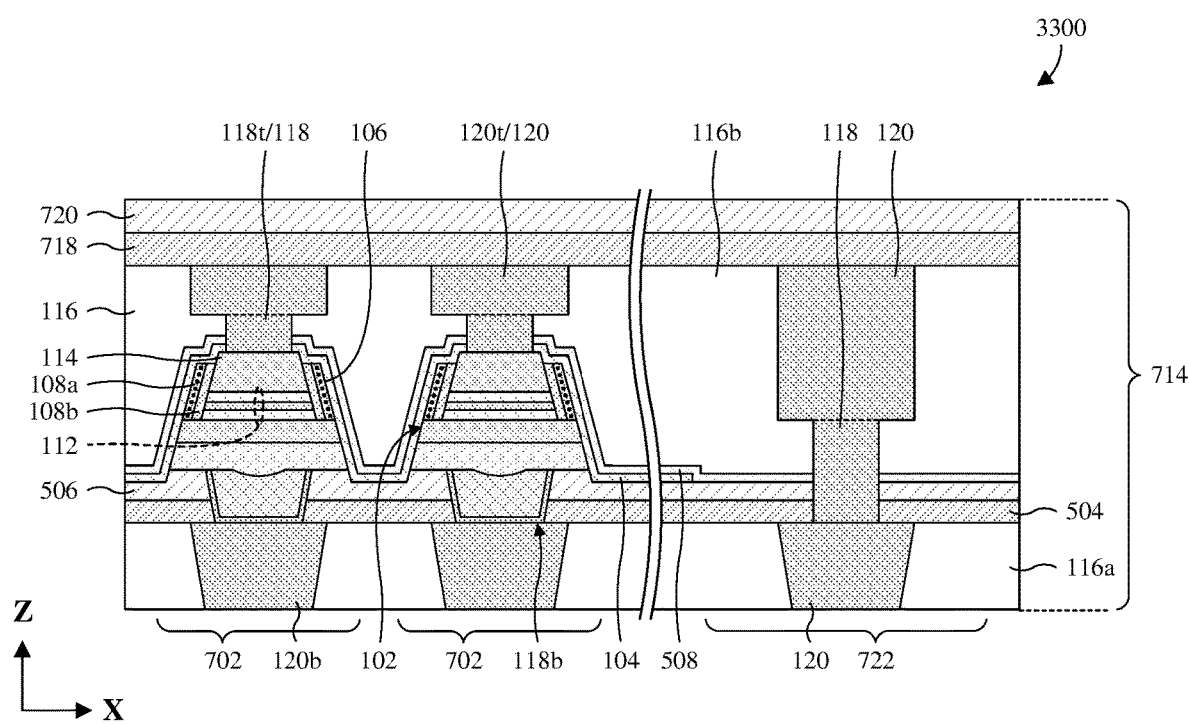

With reference to FIGS. 31-33, a series of cross-sectional views 3100-3300 of some third alternative embodiments of the method of FIGS. 10-15, 16A, 16B, and 17-23 is provided in which the sidewall spacers 108 comprise individual doped sidewall spacers 108a and individual undoped sidewall spacers 108b. The third alternative embodiments may, for example, be performed to form the IC chip with embodiments of the sidewall spacers 108 in FIG. 4C.

As illustrated by the cross-sectional view 3100 of FIG. 31, the acts described with regard to FIGS. 10-13 are performed. Further, an undoped sidewall spacer layer 1081b is deposited covering the memory cells 102 and the second via dielectric layer 506 and further lining common sidewalls formed by the hard masks 1204, the top electrodes 114, and the data storage elements 112. The undoped sidewall spacer layer 1081b may, for example, be as the sidewall spacer layer 108l is described with regard to FIG. 14 and/or may, for example, be deposited by ALD and/or some other suitable deposition process(es).

As illustrated by the cross-sectional view 3200 of FIG. 32, a doped sidewall spacer layer 1081a is formed over the undoped sidewall spacer layer 1081b to reduce charge accumulation at an interface between the doped sidewall spacer layer 1081a and a etch stop layer subsequently formed. To the extent that positive charge accumulates in the doped sidewall spacer layer 1081a at the interface, the doped sidewall spacer layer 1081a may be doped with donor dopants. To the extent that negative charge accumulates in the doped sidewall spacer layer 1081a at the interface, the doped sidewall spacer layer 1081a may be doped with acceptor dopants.

In some embodiments, the doped sidewall spacer layer 1081a is formed as described for the sidewall spacer layer 1081 with regard to FIGS. 28 and 29. For example, the doped sidewall spacer layer 1081a may be deposited undoped as described with regard to FIG. 28 and then may be doped by plasma treatment as described with regard to FIG. 29. In other embodiments, the doped sidewall spacer layer 1081a is deposited doped. Such deposition may, for example, be performed by CVD and/or some other suitable deposition As illustrated by the cross-sectional view 3300 of FIG. 33, the acts described with regard to FIGS. 15, 16A, 16B, and 17-23 are performed, except that the plasma treatment at FIG. 17 may or may not be performed. As such, the etch stop layer 104 may be doped or undoped. By performing these acts, individual doped sidewall spacers 108a and individual undoped sidewall spacers 108b are formed on sidewalls of the data storage elements 112. The doped sidewall spacers 108a are formed from the doped sidewall spacer layer 1081a and directly contact the etch stop layer 104. The undoped sidewall spacers 108b are formed from the undoped sidewall spacer layer 1081b. Because the doped sidewall spacers 108a are doped, the electric dipoles at FIGS. 16A and 16B do not, or minimally, form. For example, the doping may shift the electronegativity of the doped sidewall spacers 108a closer to that of the etch stop layer 104 to minimize the electric dipoles.

While FIGS. 31-33 are described with reference to a method, it will be appreciated that the structures shown in FIGS. 31-33 are not limited to the method but rather may stand alone separate of the method. While FIGS. 31-33 are described as a series of acts, it will be appreciated that the order of the acts may be altered in other embodiments. While FIGS. 31-33 illustrate and describe as a specific set of acts, some acts that are illustrated and/or described may be omitted in other embodiments. Further, acts that are not illustrated and/or described may be included in other embodiments.

In some embodiments, the present disclosure provides an IC chip including: a bottom electrode; a data storage element overlying the bottom electrode; a top electrode overlying the data storage element; a sidewall spacer overlying the bottom electrode on a common sidewall formed by the data storage element and the top electrode; and an etch stop layer lining the sidewall spacer; wherein the sidewall spacer and the etch stop layer directly contact at an interface and form an electric dipole at the interface, and wherein the sidewall spacer and/or the etch stop layer is/are doped to reduce charge accumulation at the interface. In some embodiments, negative charge of the electric dipole accumulates in the etch stop layer, wherein the etch stop layer is doped with acceptor dopants. In some embodiments, negative charge of the electric dipole accumulates in the etch stop layer, wherein the sidewall spacer is doped with donor dopants. In some embodiments, negative charge of the electric dipole accumulates in the etch stop layer, wherein the sidewall spacer is doped with donor dopants, and wherein the etch stop layer is doped with acceptor dopants. In some embodiments, the etch stop layer has a higher oxygen areal density than the sidewall spacer. In some embodiments, an electronegativity of the etch stop layer is less than that of the sidewall spacer. In some embodiments, positive charge of the electric dipole accumulates in the etch stop layer, wherein the etch stop layer is doped with donor dopants and/or the sidewall spacer is doped with acceptor dopants. In some embodiments, the sidewall spacer includes an undoped spacer layer and a doped spacer layer, wherein the doped spacer layer is between and directly contacts the undoped spacer layer and the etch stop layer. In some embodiments, the etch stop layer includes an undoped etch stop layer and a doped etch stop layer, wherein the doped etch stop layer is between and directly contacts the sidewall spacer and the undoped etch stop layer.

In some embodiments, the present disclosure provides another IC chip including: a bottom electrode; a MTJ element overlying the bottom electrode; a top electrode overlying the MTJ element; a sidewall spacer overlying the bottom electrode on a sidewall of the MTJ element; and an etch stop layer lining the sidewall spacer; wherein the etch stop layer is doped with acceptor dopants and/or the sidewall spacer is doped with donor dopants. In some embodiments, the etch stop layer is doped with the acceptor dopants and the sidewall spacer is undoped. In some embodiments, the sidewall spacer is doped with the donor dopants and the etch stop layer is undoped. In some embodiments, the etch stop layer and the sidewall spacer directly contact at an interface, wherein the etch stop layer and the sidewall spacer have an electric dipole in which negative charge accumulates in the etch stop layer at the interface. In some embodiments, the sidewall spacer includes silicon nitride, wherein the etch stop layer includes aluminum oxide. In some embodiments, the IC chip further includes a via overlying and directly contact the top electrode, wherein the via and the etch stop layer have individual surfaces that oppose each other and directly contact.

In some embodiments, the present disclosure provides a method including: forming a data storage element and a top electrode stacked over a bottom electrode layer with the data storage element between the top electrode and the bottom electrode layer; forming a sidewall spacer on a first common sidewall formed by the data storage element and the top electrode; performing a first etch into the bottom electrode layer with the sidewall spacer in place to form a bottom electrode underlying the data storage element; forming an etch stop layer covering the top electrode and lining a second common sidewall formed by the sidewall spacer and the bottom electrode; forming a via extending through the etch stop layer to the top electrode; and wherein the forming of the sidewall spacer includes doping the sidewall spacer, and/or wherein the forming of the etch stop layer includes doping the etch stop layer, to reduce charge accumulation at an electric dipole between the etch stop layer and the sidewall spacer. In some embodiments, the forming of the etch stop layer includes depositing the etch stop layer while simultaneously doping the etch stop layer with acceptor dopants. In some embodiments, the forming of the etch stop layer includes depositing the etch stop layer and subsequently plasma treating the etch stop layer to dope the etch stop layer with acceptor dopants. In some embodiments, the etch stop layer includes a metal oxide, wherein an atomic percentage of metal in the etch stop layer is less than 40% before the plasma treating and is more than 40% after the plasma treating. In some embodiments, the method further includes: depositing an IMD layer covering the etch stop layer; performing a second etch into the IMD layer to form a via opening overlying the top electrode, wherein the second etch stops on the etch stop layer; performing a third etch to extend the via opening to the top electrode; wherein the via is formed filling the via opening, and wherein the second etch is performed with an etchant that has an etch rate for the IMD layer that is about 20 or more times greater than that for the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a data storage element and a top electrode stacked over a bottom electrode layer with the data storage element between the top electrode and the bottom electrode layer;
    forming a sidewall spacer on a first common sidewall formed by the data storage element and the top electrode;
    performing a first etch into the bottom electrode layer with the sidewall spacer in place to form a bottom electrode underlying the data storage element;
    forming an etch stop layer covering the top electrode and lining a second common sidewall formed by the sidewall spacer and the bottom electrode;
    depositing an intermetal dielectric (IMD) layer covering the etch stop layer and having a bottom surface recessed relative to the data storage element;
    performing a second etch into the IMD layer to form a via opening overlying the top electrode, wherein the second etch stops on the etch stop layer; and
    performing a third etch to extend the via opening to the top electrode;
    forming a via extending through the etch stop layer to the top electrode and filling the via opening; and
    wherein the forming of the sidewall spacer comprises doping the sidewall spacer, and/or wherein the forming of the etch stop layer comprises doping the etch stop layer, to reduce charge accumulation at an electric dipole between the etch stop layer and the sidewall spacer.

2. The method according to claim 1, wherein the forming of the etch stop layer comprises depositing the etch stop layer while simultaneously doping the etch stop layer with acceptor dopants.

3. The method according to claim 1, wherein the forming of the etch stop layer comprises depositing the etch stop layer and subsequently plasma treating the etch stop layer to dope the etch stop layer with acceptor dopants.

4. The method according to claim 3, wherein the etch stop layer comprises a metal oxide, and wherein an atomic percentage of metal in the etch stop layer is less than 40% before the plasma treating and is more than 40% after the plasma treating.

5. The method according to claim 1,
    wherein the via is formed filling the via opening, and wherein the second etch is performed with an etchant that has an etch rate for the IMD layer that is about 20 or more times greater than that for the etch stop layer.

6. The method according to claim 1, wherein negative charge of the electric dipole accumulates in the etch stop layer, and wherein the etch stop layer is formed doped with acceptor dopants.

7. The method according to claim 1, wherein positive charge of the electric dipole accumulates in the etch stop layer, and wherein the etch stop layer is formed doped with donor dopants.

8. The method according to claim 1, wherein negative charge of the electric dipole accumulates in the etch stop layer, and wherein the sidewall spacer is formed doped with donor dopants.

9. The method according to claim 1, wherein positive charge of the electric dipole accumulates in the etch stop layer, and wherein the sidewall spacer is formed doped with acceptor dopants.

10. A method comprising:
    depositing a bottom electrode layer;
    forming a data storage element and a top electrode vertically stacked atop the bottom electrode layer;
    depositing a sidewall spacer layer overlying the top electrode and lining individual sidewalls of the data storage element and the top electrode;
    etching back the sidewall spacer layer to form a sidewall spacer on the individual sidewalls of the data storage element and the top electrode;
    depositing an etch stop layer overlying the top electrode and lining a sidewall of the sidewall spacer, wherein the etch stop layer induces charge accumulation along the sidewall of the sidewall spacer; and
    doping the etch stop layer to minimize the charge accumulation;
    wherein the doping reduces a charging voltage of the etch stop layer.

11. The method according to claim 10, wherein the etch stop layer has a higher oxygen areal density than the sidewall spacer, and wherein the doping dopes the etch stop layer with acceptor dopants.

12. The method according to claim 11, wherein the sidewall spacer is undoped.

13. The method according to claim 11, wherein the etch stop layer comprises a metal oxide, and wherein the acceptor dopants have fewer valence electrons than oxygen.

14. A method comprising:
    depositing a bottom electrode layer;
    forming a data storage element and a top electrode vertically stacked atop the bottom electrode layer;
    depositing a sidewall spacer layer overlying the top electrode and lining individual sidewalls of the data storage element and the top electrode;
    doping the sidewall spacer layer with acceptor or donor dopants;
    etching back the sidewall spacer layer to form a sidewall spacer on the individual sidewalls of the data storage element and the top electrode;

depositing an etch stop layer overlying the top electrode and lining a sidewall of the sidewall spacer; and forming a via extending through the etch stop layer from the top electrode.

15. The method according to claim 14, wherein the etch stop layer has a lower electronegativity than the sidewall spacer, and wherein the doping dopes the sidewall spacer layer with donor dopants.

16. The method according to claim 14, wherein the etch stop layer has a higher electronegativity than the sidewall spacer, and wherein the doping dopes the sidewall spacer layer with acceptor dopants.

17. The method according to claim 14, wherein the sidewall spacer comprises silicon nitride, wherein the etch stop layer comprises aluminum oxide, and wherein the doping dopes the sidewall spacer layer with donor dopants.

18. The method according to claim 14, wherein the doping dopes the sidewall spacer with one of donor dopants and acceptor dopants, and wherein the method further comprises:

doping the etch stop layer with another one of the donor dopants and the acceptor dopants.

19. The method according to claim 1, wherein the etch stop layer is a continuous layer formed of only one material and directly contacts the sidewall spacer at the second common sidewall.

20. The method according to claim 1, further comprising:

performing a fourth etch into the IMD layer to form a wire opening overlapping with the via opening and having a greater width than the via opening; and forming a wire filling the wire opening, wherein the wire and the via are concurrently formed.

\* \* \* \* \*